US009562288B2

(12) United States Patent
Slaybaugh et al.

(10) Patent No.: US 9,562,288 B2
(45) Date of Patent: Feb. 7, 2017

(54) DEFINED DOSING ATMOSPHERIC TEMPERATURE AND PRESSURE VAPOR DEPOSITION SYSTEM

(71) Applicant: DIAMON FUSION INTERNATIONAL, INC., Irvine, CA (US)

(72) Inventors: Russell C. Slaybaugh, Lake Forest, CA (US); Michael Stephen Metcalfe, Kennebunkport, ME (US); Adam Zax, Capistrano Beach, CA (US); Guillermo Seta, Porter Ranch, CA (US)

(73) Assignee: DIAMON FUSION INTERNATIONAL, INC., Irvine, CA (US)

( * ) Notice: Subject to any disclaimer, the term of this patent is extended or adjusted under 35 U.S.C. 154(b) by 115 days.

(21) Appl. No.: 14/260,233

(22) Filed: Apr. 23, 2014

(65) Prior Publication Data

US 2014/0322445 A1 Oct. 30, 2014

Related U.S. Application Data

(60) Provisional application No. 61/815,649, filed on Apr. 24, 2013.

(51) Int. Cl.
*C23C 16/00* (2006.01)
*C23C 16/448* (2006.01)
(Continued)

(52) U.S. Cl.
CPC ........... *C23C 16/4485* (2013.01); *C23C 16/44* (2013.01); *C23C 16/4408* (2013.01);
(Continued)

(58) Field of Classification Search
None
See application file for complete search history.

(56) References Cited

U.S. PATENT DOCUMENTS

| 4,118,540 A | 10/1978 | Amort et al. |
| 4,263,350 A | 4/1981 | Valimont |

(Continued)

FOREIGN PATENT DOCUMENTS

| BE | EP 2336078 A1 * | 6/2011 | ........... B67D 1/0406 |
| EP | 2336078 A1 | 2/2009 | |

(Continued)

OTHER PUBLICATIONS

Notification of Transmittal of the International Search Report and the Written Opinion of the International Searching Authority (mailing date Nov. 14, 2014 for PCT/US2014/035206, filed on Apr. 23, 2014.

(Continued)

*Primary Examiner* — David Turocy
(74) *Attorney, Agent, or Firm* — Innovation Capital Law Group, LLP; Vic Lin

(57) ABSTRACT

A closed chemical introduction system used to deliver active ingredients in liquid chemical to a chemical vapor deposition system includes a robust, moisture-free cartridge containing a defined dose of liquid chemical. The cartridge is placed on a mounting slot specially configured to receive the cartridge. Upon initiating the system, a first linear mechanical actuator securely holds the cartridge in the slot, while an extraction lance attached to a second linear mechanical actuator punctures the cartridge from the bottom, extracts the liquid chemical and delivers it to a vaporization chamber. The vaporization chamber evaporates the liquid chemical and delivers the vapors containing the active ingredients to the chemical vapor deposition system. The chemical vapor deposition system may include a treatment chamber, a (Continued)

conveyor, a compressed clean air system to provide separate treatment compartments within the chamber, a moisture system, a chemical vapor system, and a neutralization system to neutralize harmful byproducts.

12 Claims, 24 Drawing Sheets

(51) Int. Cl.
  *C23C 16/52* (2006.01)
  *C23C 16/44* (2006.01)
  *C23C 16/455* (2006.01)
  *C23C 16/54* (2006.01)

(52) U.S. Cl.
  CPC .... *C23C 16/4481* (2013.01); *C23C 16/45519* (2013.01); *C23C 16/52* (2013.01); *C23C 16/54* (2013.01)

(56) References Cited

U.S. PATENT DOCUMENTS

| | | | |
|---|---|---|---|
| 4,539,061 A | 9/1985 | Sagiv | |
| 5,337,651 A * | 8/1994 | Gardiner | C23C 16/18 417/431 |
| 5,372,851 A | 12/1994 | Ogawa et al. | |
| 5,415,927 A | 5/1995 | Hirayama et al. | |
| 5,550,570 A | 8/1996 | Kurata et al. | |
| 5,665,424 A | 9/1997 | Sherman | |
| 5,723,172 A | 3/1998 | Sherman | |
| 5,800,918 A | 9/1998 | Chartier et al. | |
| 5,853,896 A | 12/1998 | Kondo et al. | |
| 5,962,085 A | 10/1999 | Hayashi et al. | |
| 6,245,387 B1 | 6/2001 | Hayden | |
| 6,279,622 B1 * | 8/2001 | Nguyen | A61L 2/186 141/5 |
| 6,572,706 B1 * | 6/2003 | Nguyen | C23C 16/4485 118/715 |
| 7,655,932 B2 * | 2/2010 | Hatem | C23C 14/246 250/423 R |
| 2002/0157726 A1 | 10/2002 | Nguyen et al. | |
| 2007/0231485 A1 | 10/2007 | Moffat et al. | |
| 2008/0102018 A1 * | 5/2008 | Inui | B01D 7/00 423/414 |
| 2008/0171147 A1 * | 7/2008 | Singh | C23C 14/26 427/255.6 |
| 2009/0035465 A1 | 2/2009 | Marsh et al. | |
| 2010/0203260 A1 | 8/2010 | Moffat et al. | |
| 2011/0283943 A1 * | 11/2011 | Pei | C23C 14/24 118/728 |

FOREIGN PATENT DOCUMENTS

| | | | | |
|---|---|---|---|---|
| EP | 2266631 A1 * | 12/2010 | | A61L 2/186 |
| JP | WO 0138602 A1 * | 5/2001 | | C23C 16/047 |

OTHER PUBLICATIONS

Extended European Search Report dated Nov. 11, 2016 from counterpart European Application No. EP14788444, 9 pages.
Office Action dated Dec. 19, 2016 from related U.S. Appl. No. 14/260,231, 27 pages.

* cited by examiner

DEFINED DOSING ATMOSPHERIC TEMPERATURE AND PRESSURE VAPOR DEPOSITION SYSTEM

RELATED APPLICATIONS

This application relates to, claims priority from, and incorporates herein by reference, as if fully set forth in U.S. Provisional Patent Application Ser. No. 61/815,649 filed on Apr. 24, 2013 and entitled "Defined Dosing Atmospheric Temperature and Pressure Vapor Deposition System."

BACKGROUND OF THE INVENTION

1. Field of the Invention

The invention relates generally to the devices and methods for introducing active chemical ingredients to a treatment chamber of an automated chemical vapor deposition system and creating protective films and coatings on organic and inorganic substrates by a chemical vapor deposition.

2. Description of Prior Art and Related Information

Many glass-based consumer products, such as beverage containers, food containers, sunglass lenses, automotive windshields and windows, require protective coating to guard against scratches, stains and breakage due to blunt impacts. Various techniques for creating protective films and coatings on substrates such as glass, silica based glass, and even metal oxide based steel are known in the art. Some of these known techniques include manual application of active chemical ingredients by hand and automated application by chemical vapor deposition process.

Manual application of active ingredients on a substrate is typically done by spraying chemical solutions onto a surface of the substrate by hand or by using a handheld machine. While manual application may produce an effective coating, such application is slow, labor intensive, creates safety concerns, and scales poorly for large volume applications. Moreover, the active ingredients used in creating films or coatings on substrates often require highly volatile and flammable organic solvents to aid in the application process, as the active ingredients generally do not provide an effective coating when applied to substrates in their pure form. During manual application by hand, chemical solutions can spill, be over sprayed onto the surface of the substrate, damage work surfaces and floors, and create a hazardous work environment. For instance, the organic solvents used with the active ingredients may evaporate into the surrounding air and create a health hazard to the technician performing the manual application. Because of these risks, the technician performing the manual application is required to wear personal protective equipments to avoid breathing in vapors. Further, the common occurrence of chemical spillage during manual applications increases the risks of releasing great amounts of harmful chemicals to the environment, damaging equipments and inventory, and creating fire and slip-and-fall injuries in the workplace.

To address the issue of releasing harmful solvent vapor associated with manual application of chemical solutions, some techniques in the prior art employ a vapor extraction system that confines solvent fumes by entirely performing the manual application inside an extraction booth. However, performing the manual application inside the extraction booth reduces scalability, increases the need for personal protective equipment for the technician, and greatly increases the risk of personal injury to the technician in the event that the safety measures implemented in the extraction system fail.

Some of the aforementioned problems can be overcome by automated chemical vapor deposition processes known in the art. Chemical vapor deposition processes greatly reduce the human labor involved in applying active ingredients onto the substrates, and in turn, reduce the labor costs and the risks of hazard to the technician and the environment. However, many chemical vapor deposition processes known in the art require applying the active ingredients onto the substrates under vacuum inside vacuum chambers. Vacuum chambers are typically slow in evacuating chemical vapors and limited in capacity, as there is a certain limitation to the maximum physical size of substrates that can be coated using chemical vapor deposition processes inside vacuum chambers. Thus, while the manual labor costs and the risk of releasing harmful vapors are reduced, the size limitation of vacuum chambers does not solve scalability problems, and in fact, dramatically reduces production capacity.

Yet, other known chemical vapor deposition techniques for creating films on substrates teach performing the chemical vapor deposition at atmospheric pressure and without the use of vacuum chambers, which address the issues of scalability, labor costs and vapor release. Such techniques are typically performed in room-sized application chambers that remain at atmospheric pressure throughout the vapor deposition process. These room-sized chambers provide the advantage of allowing high volume applications of active ingredients with minimal labor requirements. The operator of such chamber can load large amounts of large substrates into the chamber and apply film coating to every exposed surface with active ingredients in a relatively short amount of time. Typically, such operation can be completed under an hour. However, the operator of this type of chamber is required to carefully measure the precise quantities of the correct active ingredients, manually inject them into a chemical introduction system during the operation of the chamber and perform certain steps at very specific times during the process. When doing so, the operator must wear personal protective equipments to avoid breathing in toxic fumes and to protect against chemical spills, as these active ingredients are often flammable and stored in glass bottles. The fragility of glass bottles combined with the toxicity of the active ingredients present a significant hazard when the bottles are dropped or the contents are spilled. Additionally, the active ingredients used in such chemical vapor deposition processes are typically air sensitive. Thus, the operator must apply an inert gas blanket, such as nitrogen, when opening the bottles to reduce the decomposition rate of the active ingredients due to air exposure. Most users of this type of chamber do not have the necessary equipments to perform a nitrogen blanket. Further, even when a nitrogen blanket is used, some air exposure is unavoidable when operating such chambers.

BRIEF SUMMARY OF THE INVENTION

A current chemical introduction system that embodies the invention described herein solves the problems encountered in the prior art discussed above. For instance, the current chemical introduction system permits the use of multiple systems in parallel or in series to allow large scale chemical vapor deposition process. Further, the current chemical introduction system improves the safety of performing a chemical vapor deposition by eliminating exposure to harmful vapors during the process, eliminating the risk of chemical spills from dropping and breaking a conventional glass stock bottle containing active ingredients, eliminating emission of harmful chemical vapors to the environment, and reducing process failure due to human errors from using the wrong dosage or the wrong type of chemical. In addition, the current chemical introduction system described herein significantly increases the operator's productivity, as the need for continuous monitoring of the process or performing certain steps at the proper times is no longer required.

In another aspect, a continuous, conveyance chemical vapor deposition system that embodies the invention described herein facilitates a fully automated, large scale film coating of any glass-like product with zero emission of harmful vapors. In a preferred embodiment, the chemical vapor deposition system described herein may be operated continuously for 24 hours to allow uninterrupted in-line production. Further, the preferred embodiment of the conveyance chemical vapor deposition can be easily modified and adapted to any type of production line, by adjusting its width and/or length as each particular product might require, thus offering a unique adaptability and flexibility to meet any manufacturing requirements.

As will be described in further details below, the preferred embodiment of the current system utilizes various cartridge sizes and shapes that contain precise dosages of active ingredients that suit the need for a particular treatment of substrates, such as glass containers, beverage containers (e.g., wine bottles, beer bottles, soda bottles, etc.) food containers, sunglass lenses, automotive windshields and windows, or any type of consumer products.

One example of a commercial application of the current chemical vapor deposition system is a labeling of sparkling wine bottles. Sparkling wine bottles, due to its intrinsic properties, are traditionally filled in a production line under a certain low temperature. Subsequently, the temperature must be increased to enable labeling on each bottle. In a large scale production, the temperature is increased by submerging the bottles in the production line inside a water pool and heating the water for a period of time until the labels can properly adhere to the glass bottles. In a small scale production, the bottles must be removed from the production line, submerged in the heated water, left in ambiance temperature for several days to cool down, and then brought back to the production line for labeling. This laborious process slows down production, increases the probability of bottle breakage and requires a large working space.

The current embodiment of the current chemical vapor deposition allows the sparkling wine bottles to be coated with special ingredients that allow labels to be affixed to the bottles dry, without requiring the bottles to be submerged in a large water pool. Thus the current system helps save energy, labor and costs, and reduces the use of water.

Other examples of commercial application of the current chemical vapor deposition system may include, but not limited to, applications of anti-drip coating (such as on red wine bottles), scratch and impact resistance coating, and coating on the inside surface of beverage bottles (such as the inside coating of champagne bottles).

The present invention provides devices and methods for introducing precise dosages of active chemical ingredients contained in completely sealed and moisture-free cartridges to a substrate in a fully closed automatic chemical vapor deposition system. Further, the present invention also provides devices and methods of creating protective films and coatings on organic and inorganic substrates by a continuous application of chemical vapor deposition in a conveyance type of system.

In one aspect, an automated liquid chemical introduction system for a chemical vapor deposition process for coating a substrate with film layer is provided. The chemical introduction system may comprise a cartridge insertion assembly, a liquid chemical extraction assembly, and a vaporization assembly. A programmable logic controller (PLC) is provided to concurrently control the chemical introduction system and a chemical vapor deposition system.

A specially designed cartridge that contains a precise amount of active ingredient for the chemical vapor deposition is provided. The cartridge may comprise a moisture-free vial containing the desired liquid chemical, a resealing septum to seal the opening of the vial, a vial cap to fasten the resealing septum, and a thick cartridge shell having a hollow chamber to securely place the vial inside the shell. As different types of chemicals may be used in a particular chemical vapor deposition process, various cartridge shells having specific shapes for specific chemicals may be used to help distinguish the contents of the cartridges and eliminate human error. Preferably, the cartridges are prepared by the supplier of the active ingredients. Thus, the cartridges eliminate the need for an operator of the chemical vapor deposition system to manually measure the quantities of the correct active ingredients, manually inject the active ingredients into the chemical introduction system, and perform certain steps at specific times.

The cartridge insertion assembly preferably forms the uppermost component of the chemical introduction system. According to a preferred embodiment, the cartridge insertion assembly comprises a cartridge tray having a mounting slot that is specifically designed to receive a bottom portion of the cartridge with a matching shape. Above the cartridge tray, an upper linear mechanical actuator that is movable in a vertical direction is provided. In a preferred embodiment, the upper linear mechanical actuator may further comprise a retainer clip that is used to securely hold the cartridge in place during extraction of the active chemicals. In an alternative embodiment, the upper linear mechanical actuator may further comprise a clear containment cover. In an embodiment where the clear containment cover is included, an inert gas line, such as a nitrogen line, supplies inert gas to the cartridge insertion assembly to keep ambient moisture out when the system is running. In either embodiment, upper linear mechanical actuator may be automatically operated by the PLC or manually operated by hand.

In another aspect, the cartridge tray may comprise a plurality of mounting slots, a plurality of clear containment covers and a plurality of inert gas lines to allow multiple chemicals to be used simultaneously. The liquid chemical extraction assembly preferably forms the middle component of the chemical introduction system and is located below the cartridge insertion assembly. Preferably, it comprises a lower linear mechanical actuator movable in a vertical direction, an extraction lance attached to the lower linear mechanical actuator, a ridged sleeve covering the extraction lance, and a chemical collection block to collect extracted liquid chemical. The lower mechanical actuator may be automatically operated by the PLC or manually operated by hand. The ridged sleeve provides containment protection to ensure that no harmful vapors from the active ingredients escape and no ambient moisture enters during the chemical extraction. In an alternative embodiment, a bellow covering the ridged sleeve may be provided as an additional fume containment layer. In one aspect, a second inert gas line is connected to the extraction lance to assist complete extraction of the liquid chemical from the cartridge using inert gas pressure. In yet another aspect, a plurality of liquid chemical extraction assemblies may be provided to allow extraction of multiple cartridges simultaneously.

The vaporization assembly preferably forms the lowermost portion of the chemical introduction system and is located below the liquid chemical extraction assembly. It may comprise a vaporization chamber, a chemical liquid inlet connected to the chemical collection block that delivers extracted chemical from the chemical extraction assembly to the vaporization chamber, a compressed air supply and a chemical vapor outlet that delivers active chemical vapors from the vaporization chamber to a treatment chamber of the chemical vapor deposition system. In one aspect, a plurality of vaporization assemblies may be provided to allow isolation and vaporization of a plurality of individual or combined liquid chemicals and delivery of the resulting vapors to the treatment chamber.

According to a preferred embodiment, the operation of the automated liquid chemical introduction system begins by placing the cartridge on the mounting slot, wherein the resealing septum side of the cartridge is facing down. Because the mounting slot is designed with a specific shape that can only receive the cartridge with a matching shape, the configuration ensures that the cartridge is properly placed in the mounting slot and the correct type of active ingredient is being used. A substrate to be treated is placed in the treatment chamber of the chemical vapor deposition system.

After the cartridge is securely placed on the mounting slot, the operator initiates an automated program on the PLC to activate both the chemical introduction system and the chemical vapor deposition system. In one embodiment, a hygrometer is provided outside of the treatment chamber of the chemical vapor deposition system to first measure the ambient humidity prior to treating the substrate with the active ingredient. Upon receiving the humidity data from the hygrometer, the PLC then calculates a proper runtime to introduce humidity to the treatment chamber based on a predetermined formula. Subsequently, the PLC then engages a humidifier to inject moisture into the treatment chamber of the chemical vapor deposition system according to the predetermined runtime. After the humidification process is complete, the PLC then evacuates the ambient air from the treatment chamber to remove as much airborne moisture as possible, leaving only moisture on the substrate for chemical treatment.

Simultaneous with the initiation of the chemical vapor deposition system, the PLC initiates the program on the chemical introduction system. The upper linear mechanical actuator begins to move in a downward direction to allow the retainer clip to securely hold down the cartridge in the mounting slot in preparation of the chemical extraction process. In an embodiment where the clear containment cover is provided, the clear containment cover secures the cartridge in the mounting slot and completely encloses the cartridge to prevent chemical fume emission and outside moisture intrusion. In that embodiment, after the cartridge is completely enclosed by the clear containment cover, nitrogen gas is supplied according to a predetermined time to drive out moisture and ensure an airtight seal.

Additionally, in a preferred embodiment, a pressure sensor detector is provided to detect and report a leak to the PLC. If a leak is reported, the PLC will pause the process until the issue is resolved.

Upon completion of the cartridge retention in the mounting slot, either by the mechanical actuator or by manual setting, and the leak detection process ascertains that there is no leak, a tubing system that carries the active chemicals to the vaporization chambers is flushed with nitrogen flowing from the extraction lance. Once the nitrogen flush is complete, the chemical introduction system then waits until the humidification process of the treatment chamber is complete.

Once the humidification process of the treatment chamber is complete, the PLC then initiates the lower linear mechanical actuator to move in an upward direction to raise the attached extraction lance until the extraction lance penetrates the resealing septum of the cartridge. The extraction lance comprises a vertical groove that runs along the length of the lance, a hollow central lumen, and at least a circumferential groove. Preferably, the extraction lance may comprise two circumferential grooves. The vertical groove of the lance allows the liquid chemical to drain down towards the chemical collection block. The circumferential grooves grab the resealing septum at the penetration point and when the lower mechanical actuator reverses a few millimeters, it slightly pulls down the resealing septum to form a funnel for better collection of the liquid chemical. Nitrogen is supplied into the cartridge vial through the hollow central lumen to create pressure inside the vial and further drive the liquid chemical down through the vertical groove for complete extraction.

The chemical extraction block directs the extracted liquid chemical to the vaporization chamber through the chemical liquid inlet. Once the liquid chemical is collected inside the vaporization chamber, compressed air is supplied into the vaporization chamber to evaporate the liquid state of the active ingredient and carry its vapor state into the treatment chamber for chemical vapor deposition. Upon entering the treatment chamber, the vapor containing the precise dosage of active ingredient reacts with the moisture on the surface of the substrate to create a film coating on the surface of the substrate. An example of such film coating process is described in U.S. Pat. No. 6,245,387, incorporated by reference herein. According to the preferred embodiment, the chemical vapor deposition process is performed under ambient temperature and pressure.

In one embodiment of the chemical vapor deposition system, the air within the treatment chamber is circulated according to a predetermined period of time using a specially designed fan and tubing system to ensure an ideal amount of air turbulence. The air turbulence is intended to optimize the vapor deposition on the substrate. At the conclusion of the chemical vapor deposition process, any remaining chemical vapors and airborne byproducts are evacuated through an air-scrubber that filters the air and neutralizes any airborne acid. This air scrubber may comprise a particle filter and a series of trays filled with acid-absorbing or neutralizing media.

In another embodiment, the chemical vapor deposition system may include a conveyance, assembly line type of system inside a fully contained tubular/cylindrical treatment chamber. Preferably, the cylindrical treatment chamber may comprise a conveyor belt, a plurality of air curtains to divide the interior of the treatment chamber into separate treatment compartments, a water vapor system, a chemical vapor system, a vacuum system to evacuate unreacted active ingredients and acidic byproducts, and a neutralization system connected to the vacuum system to evacuate and neutralize unreacted active ingredients and acidic byproducts before the carrying air is released to the environment. The water vapor system may further comprise a plurality of water vapor inlets placed above and along the length of the conveyor belt. Similarly, the chemical vapor system may further comprise a plurality of chemical vapor inlets placed above and along the length of the conveyor belt. Preferably, the plurality of water vapor inlets and the plurality of chemical vapor inlets are configured in an alternating fashion according to the desired coating process. The vacuum system may further comprise a plurality of vacuum channels placed below and along the length of the conveyor belt. The neutralization system may comprise a neutralizing solvent reservoir, a vapor duct placed below the conveyor belt, a plurality of neutralizing solvent inlets inside the vapor duct, and a pump that draws neutralizing solvent from the solvent reservoir to the plurality of solvent inlets. Alternatively, the neutralization system may comprise an air scrubber further comprising a particle filter and a series of trays filled with acid-absorbing or neutralizing media.

As stated above, the interior of the cylindrical treatment chamber is divided into multiple compartments by the plurality of air curtains to prevent cross-contamination of moisture and chemical vapors. In a preferred embodiment, a first compartment may comprise a first water vapor inlet placed in between a first pair of air curtains, a second compartment may comprise a first chemical vapor inlet placed in between a subsequent pair of air curtains, a third compartment may comprise a second water vapor inlet placed in between a third pair of air curtains, a fourth compartment may comprise a second chemical vapor inlet placed in between yet a fourth pair of air curtains, and a fifth compartment may comprise a compressed air nozzle placed in between a last pair of air curtains.

According to the preferred embodiment, the substrate to be treated is placed on the conveyor belt and moved into the cylindrical treatment chamber for a series of water and chemical vapor treatments. As the substrate enters the first compartment, the first water vapor inlet deposits moisture onto the surface of the substrate as it is conveyed through that compartment of the treatment chamber. It is then conveyed through the air curtain leaving only the moisture on the surface of the substrate. A vacuum channel at the exit of this first compartment removes any water vapor on the margin, ensuring none enters the next compartment of the process. Subsequently, the substrate enters the second compartment for a chemical vapor deposition treatment of a first active ingredient.

In the second compartment, the first chemical vapor inlet deposits the vapor of the first active chemical ingredient onto the substrate as it is conveyed through that second compartment of the treatment chamber. The moisture on the surface of the substrate reacts with the chemical vapor to form a film coating on the surface of the substrate. After the first chemical vapor deposition is complete, a second vacuum channel evacuates the unreacted chemical ingredients and acidic byproducts into the vapor duct below the conveyor belt ensuring none passes into the next compartment of the treatment chamber.

Upon entering the third compartment, a second water vapor inlet deposits moisture onto the surface of the substrate as it is conveyed through the third compartment of the treatment chamber, in preparation for a second treatment of a second active chemical ingredient. Similar to the first moisture treatment, as the substrate exits this compartment, it is conveyed through a third air curtain leaving only moisture on the surface of the substrate and a third vacuum channel evacuates airborne moisture into the vapor duct ensuring no water vapor enters the next compartment. The substrate then enters the fourth compartment for a chemical vapor deposition treatment of the second active ingredient.

In the fourth compartment, the second chemical vapor inlet deposits the vapor of the second active ingredient onto the surface of the substrate as it is conveyed through the fourth compartment. The moisture on the surface of the substrate reacts with the chemical vapor to form a second film coating on the surface of the substrate. At the exit of this compartment, a fourth vacuum channel evacuates the unreacted chemical ingredients and acidic byproducts at the margin into the vapor duct below the conveyor belt, and the substrate passes through a fifth air curtain and continues into the fifth compartment.

In the fifth compartment, a compressed air nozzle applies high pressure compressed air onto the substrate as it is conveyed through the fifth compartment to remove excess chemicals from the surface of the substrate. Additionally, a fifth vacuum channel may be provided to further evacuate unreacted chemical ingredients and acidic byproducts. After the process is complete, the treated substrate then exits the chemical vapor deposition chamber.

It is to be understood that the conveyance chemical vapor deposition system may be used in conjunction with the cartridge system for a defined dosage, or alternatively, independent of the cartridge system, for a continuous application of active ingredients. It is also to be understood that the conveyance chemical vapor deposition system may employ more than two types of active ingredients, and as such may comprise multiple moisturization compartments and multiple chemical vapor treatment compartments. Lastly, it is to be understood that the chemical vapor deposition process according to this preferred embodiment is performed under ambient temperature and pressure.

In another aspect, a method of automatically introducing air-sensitive liquid chemical to a substrate in a closed chemical vapor deposition system is provided. The method may comprise providing a moisture-free cartridge containing a defined dosage of specific liquid chemical for a chemical vapor deposition process, providing a closed extraction mechanism to extract the liquid chemical from the cartridge, and delivering active ingredients in the extracted liquid chemical to a treatment chamber of the chemical vapor deposition system.

The step of providing a moisture-free cartridge containing a defined dosage of specific liquid chemical for a chemical vapor deposition process may further comprise removing ambient moisture from a vial according to a predetermined amount of time, dispensing the defined dosage of the liquid chemical into the vial under inert gas blanket, sealing the vial with a resealing septum and a cap, and placing the vial inside a protective shell.

The step of providing a closed extraction mechanism to extract the liquid chemical from the cartridge may further comprise providing a mounting slot configured to receive the cartridge that matches the mounting slot, providing an upper linear mechanical actuator above the mounting slot that is movable in a vertical direction to secure the cartridge during liquid chemical extraction, providing an extraction lance attached to a lower linear mechanical actuator below the mounting slot that is movable in a vertical direction to extract liquid chemical from the cartridge, and providing a chemical collection block to collect the extracted liquid chemical.

The step of delivering active ingredients in the extracted liquid chemical to a treatment chamber of the chemical vapor deposition system may further comprise providing a vaporization chamber to receive the liquid chemical from the chemical collection block, drawing compressed air over the liquid chemical according to a predetermined amount of time to evaporate the liquid chemical, and delivering active ingredients in a vapor state to the treatment chamber through an outlet by applying further compressed air pressure to the vaporization chamber.

In another aspect, a method of automatically introducing air sensitive liquid chemical to a substrate in a closed chemical vapor deposition system comprising providing a moisture-free cartridge containing a defined dosage of specific liquid chemical for a chemical vapor deposition process, providing a mounting slot configured to receive the cartridge, securely holding the cartridge in the mounting slot upon initiating the system, extracting liquid chemical from the cartridge in a closed environment, and delivering active ingredients contained in the liquid chemical to a treatment chamber of a chemical vapor deposition system.

The step of providing a moisture-free cartridge containing a defined dosage of specific liquid chemical for a chemical vapor deposition process may comprise removing ambient moisture from a vial according to a predetermined amount of time, dispensing the defined dosage of the liquid chemical into the vial under inert gas blanket, sealing the vial with a resealing septum and a cap, and placing the vial inside a protective shell.

The step of providing a mounting slot configured to receive the cartridge may further comprise providing a mounting slot with a shape that matches the bottom portion of the cartridge.

The step of securely holding the cartridge in the mounting slot upon initiating the system may comprise providing an upper linear mechanical actuator that is movable in a vertical direction to securely hold the cartridge in the mounting slot upon initiating the system. In one embodiment, this step may further comprise providing a retainer clip attached to the upper linear mechanical actuator. In an alternative embodiment, this step may further include providing a clear containment cover attached to the upper linear mechanical actuator that completely encloses the cartridge. Further, this step may be performed automatically using a PLC or manually by hand. The step of extracting liquid chemical from the cartridge in a closed environment may comprise providing an extracting lance attached to a lower linear mechanical actuator that is movable in a vertical direction, wherein the lower mechanical actuator raises the lance to puncture the cartridge and draw the liquid chemical upon initiating the system, and wherein the extracting lance supplies nitrogen pressure into the cartridge, and providing a chemical extraction block to collect the liquid chemical.

The step of delivering active ingredients contained in the liquid chemical to a treatment chamber of a chemical vapor deposition system may comprise providing a vaporization compartment configured to evaporate the liquid chemical extracted from the cartridge to a vapor state and carry active ingredients in the vapor to a treatment chamber of a chemical vapor deposition system.

In yet another aspect, a method of preparing a moisture-free cartridge containing air-sensitive liquid chemical for use in a chemical vapor deposition system is provided. The method may comprise removing ambient moisture from a vial according to a predetermined amount of time, dispensing the defined dosage of the liquid chemical into the vial under inert gas blanket, sealing the vial with a resealing septum and a cap, and placing the vial inside a protective shell.

The step of removing ambient moisture from a vial according to a predetermined amount of time may further comprise flushing the vial with nitrogen gas according to a predetermined amount of time. In an alternative embodiment, the step of removing ambient moisture from a vial according to a predetermined amount of time may further comprise applying vacuum pressure to the vial according to a predetermined amount of time and filling the vial with nitrogen gas.

The step of placing the vial inside a protective shell may further comprise providing the protective shell having a shape configured to fit in a mounting slot of an automated chemical introduction system.

In yet another aspect, a method of creating protective film coatings on organic and inorganic substrates by chemical vapor deposition is provided. The method may comprise providing a conveyance treatment chamber comprising a conveyor, a moisture treatment system, a chemical vapor deposition system, a compressed clean air system and a vapor neutralization system; separating the moisture treatment system and the chemical vapor deposition within the treatment chamber using the compressed clean air system to prevent cross-contamination between moisture and active chemical ingredients; placing a substrate on a conveyor to allow the substrate to undergo a series of moisture and chemical vapor treatments; and neutralizing any unreacted chemical ingredients and chemical byproducts by evacuating the unreacted chemical ingredients and the chemical byproducts to the vapor neutralization system prior to releasing the carrying air to open air.

The step of providing a conveyance treatment chamber comprising a conveyor, a moisture treatment system, a chemical vapor deposition system, a compressed clean air system and a vapor neutralization system may further comprise placing the moisture treatment system above and along the conveyor, wherein the moisture treatment system includes a plurality of water vapor inlets. This step may also comprise placing the chemical vapor deposition system above and along the conveyor, wherein the chemical vapor deposition system includes a plurality of chemical vapor inlets.

The step of separating the moisture treatment system and the chemical vapor deposition within the treatment chamber using the compressed clean air system to prevent cross-contamination between moisture and active chemical ingredients may further comprise providing a central clean air source, providing a main air duct connected to the clean air source, and providing a plurality of air curtains connected to the main air duct, placed above and along the length of the conveyor to separate a moisture treatment compartment and a chemical vapor compartment using an air curtain.

The step of neutralizing any unreacted chemical ingredients and chemical byproducts by evacuating the unreacted chemical ingredients and the chemical byproducts to the vapor neutralization system prior to releasing the carrying air to open air may further comprise providing a plurality of vacuum channels at the margin of each compartment below the conveyor to evacuate the unreacted active ingredients and byproducts to a vapor duct, providing a solvent reservoir containing a neutralizing agent, providing a plurality of neutralizing solvent inlets in the vapor duct, and providing a solvent pump to draw the neutralizing agent from the solvent reservoir and deliver the neutralizing agent to the plurality of solvent inlets to neutralize harmful vapors inside the vapor duct prior to releasing the vapors. Alternatively, this step may comprise providing an air scrubber further comprising a particle filter and a series of trays filled with acid-absorbing or neutralizing media.

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

DETAILED DESCRIPTION OF THE PREFERRED EMBODIMENTS

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

Figure 1:
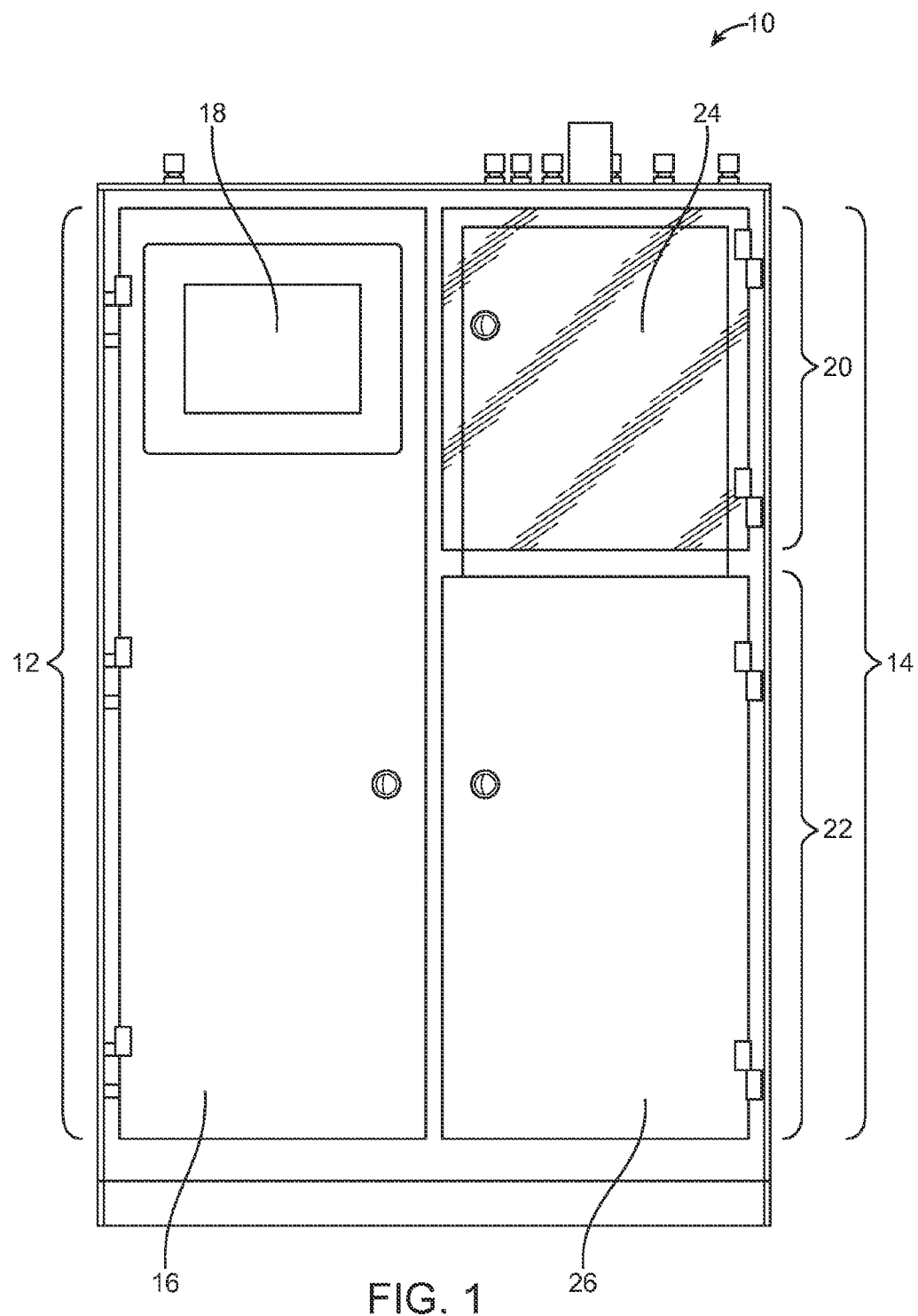
FIG. 1 is a front view of a preferred embodiment of an automated chemical introduction system with its doors closed.

In FIG. 1, a preferred embodiment of an automated liquid chemical introduction system, or simply a chemical introduction system, is designated by a reference numeral 10. Here, an exterior front view of the chemical introduction system 10 is shown. As illustrated in FIG. 1, the chemical introduction system 10 preferably comprises two compartments, a control panel compartment 12 and a liquid chemical delivery compartment 14. The control panel compartment 12 houses an electrical control, a programmable logic controller (PLC), and various electrical and computer wirings that concurrently control the operation of the chemical introduction system 10 and a chemical vapor deposition system (not pictured). The liquid chemical delivery compartment 14 houses automated mechanisms that perform extractions of liquid chemicals contained inside sealed cartridges 40 (shown in later figures), vaporizations of the liquid chemicals, and delivery of vapors containing active ingredients to the chemical vapor deposition system for a vapor deposition treatment of a substrate.

The control panel compartment 12 is enclosed by a control panel compartment door 16. The control panel compartment door 16 further comprises a touch-screen PLC control module 18 on its exterior to allow an operator to set a desired program or control certain variables of the operation of the chemical introduction system 10 and the chemical vapor deposition system, such as temperature, inert gas pressure, runtime, and so forth.

Figure 2:
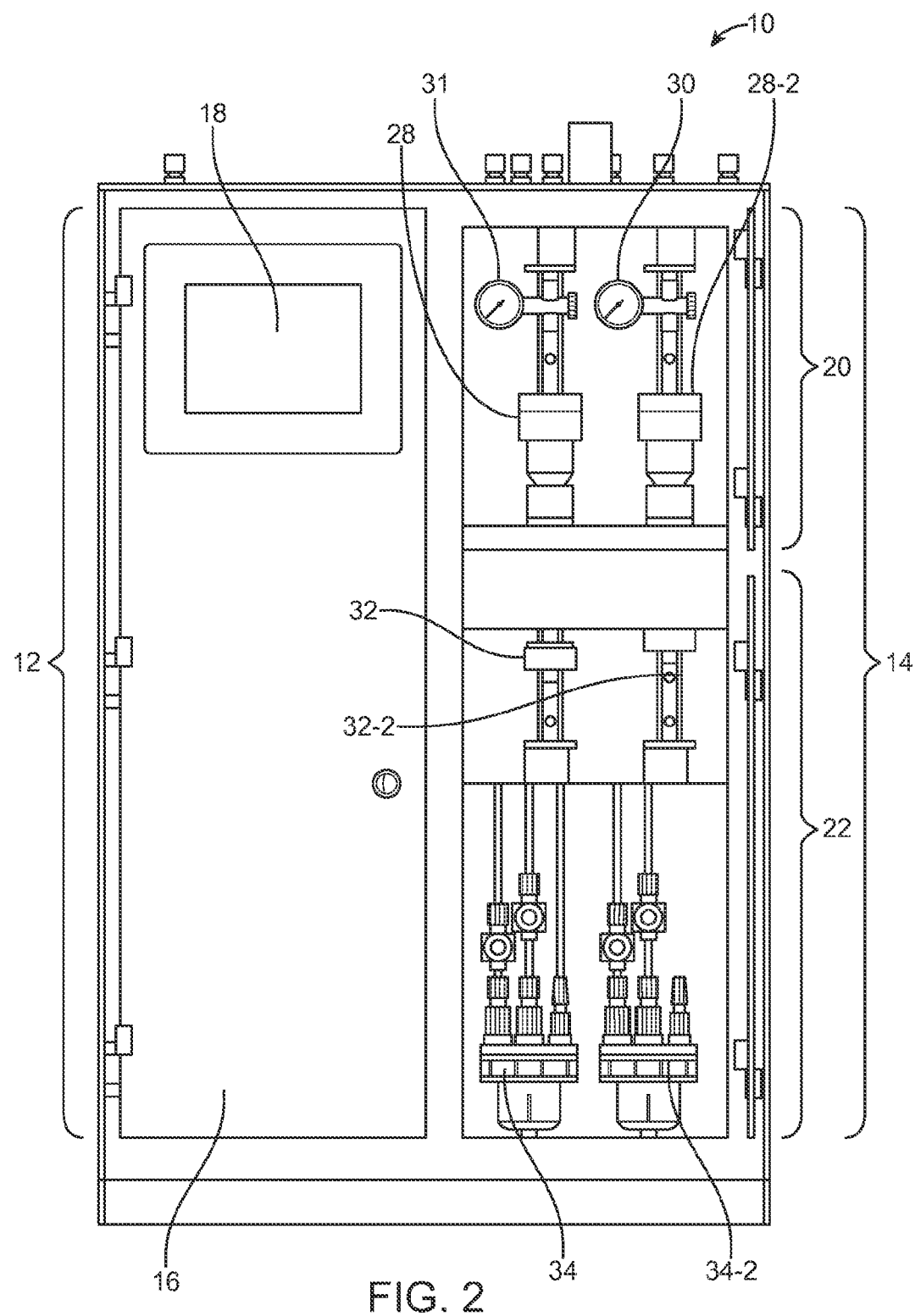
FIG. 2 is a front view of the preferred embodiment of the automated chemical introduction system with its doors open.

As shown in FIGS. 1 and 2, the liquid chemical delivery compartment 14 preferably comprises a top cartridge compartment 20 and a bottom liquid chemical vaporization compartment, or simply a vaporization compartment, 22. The cartridge compartment 20 is enclosed by a cartridge compartment door 24 and the vaporization compartment 22 is enclosed by a vaporization compartment door 26. The cartridge compartment door 24 allows the operator to easily replace cartridges 40 without having to open the entire liquid chemical delivery compartment 14, and create a risk of harmful vapor release. In one embodiment, the cartridge compartment door 24 may comprise clear glass so that the operator can see the interior of the cartridge compartment 20.

FIG. 2 illustrates a general overview of the interior of the liquid chemical delivery compartment 14 according to a preferred embodiment. As shown, the cartridge compartment 20 generally houses a cartridge insertion assembly 28, an inert gas (such as nitrogen) gauge valve 30 and a compressed air gauge valve 31. According to a preferred embodiment, the cartridge compartment 20 may house a plurality of cartridge insertion assemblies 28 to allow a plurality of cartridges 40 containing different liquid chemicals to be used during the same operation. By way of example only and not as a limitation, FIG. 2 shows a second cartridge insertion assembly 28-2, where elements of similar structure are designated by the same reference numerals followed by "-2". Preferably, the cartridge insertion assembly 28 forms the uppermost component of the chemical introduction system 10. It is to be understood that more than two cartridge insertion assemblies 28 may be used in the current system 10.

The vaporization compartment 22 generally houses an extraction assembly 32 and a vaporization assembly 34. As shown here, the extraction assembly 32 preferably forms the middle component of the chemical introduction system 10, located below the cartridge insertion assembly 28 and above the vaporization assembly 34. According to a preferred embodiment, the vaporization compartment 22 may house a plurality of extraction assemblies 32 and a plurality of vaporization assemblies 34 to allow various liquid chemicals to be used in the same operation. By way of example only and not as a limitation, FIG. 2 shows a second extraction assembly 32-2 and a second vaporization assembly 34-2, where elements of similar structure are designated by the same reference numerals followed by "-2". As seen in FIG. 2, it is to be understood that the first cartridge insertion assembly 28 is connected to the first extraction assembly 32 and the first vaporization assembly 34, the second cartridge insertion assembly 28-2 is connected to the second extraction assembly 32-2 and the second vaporization assembly 34-2, and so forth, which will be discussed in further details below. It is to be understood that more than two extraction assemblies 32 and more than two vaporization assemblies 34 may be used in the current system 10.

Figure 3:
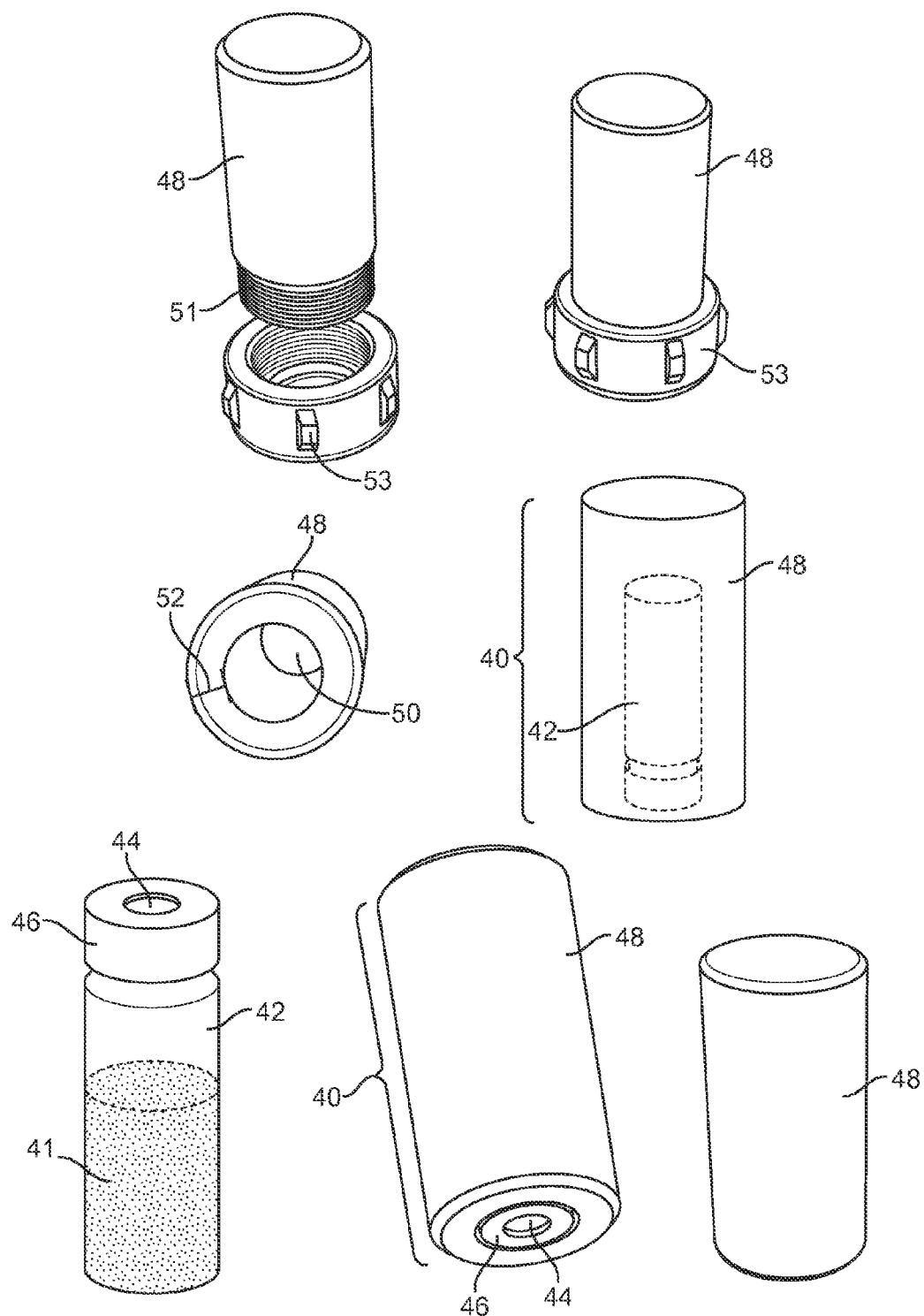
FIG. 3 is a perspective view of a preferred embodiment of a cartridge of the chemical introduction system.

FIG. 3 illustrates a preferred embodiment of the cartridge 40 that is specially designed to be used with the chemical introduction system 10. As shown here, the cartridge 40 comprises a cartridge vial 42 containing liquid chemical 41, a resealing septum or other acceptable barrier, simply referred to herein as a barrier, 44, a vial cap 46, and a shell 48. In this embodiment, the shell 48 is illustrated as having a cylindrical shape. The shell 48 further comprises a hollow chamber 50 and a wall thickness 52. In a preferred embodiment, the cartridge 40 is assembled by placing the vial 42 inside the hollow chamber 50. In an alternative embodiment, a shell bottom cover may be provided to prevent the vial 42 from slipping out of the hollow chamber 50, yet allow puncture access to the barrier 44. Although the vial 42 and the shell 48 may be made of any suitable organic and inorganic materials, the vial 42 is preferably made of glass and the shell 48 is preferably made of hard, durable molded polymers such as expanded polypropylene or other suitable chemically inert polymers.

The cartridge 40 contains a defined dosage of specific liquid chemical for the chemical deposition process. Preferably, the cartridge 40 is prepared by the supplier of the active ingredients to obviate the need for the operator of the chemical vapor deposition system to manually measure the quantity of the correct active ingredient and inject the active ingredient into chemical vapor deposition system by hand.

Due to the air sensitivity of the active ingredients to ambient moisture, a special preparation of the cartridge 40 to eliminate air and moisture inside the vial 42 is required. According to a preferred embodiment, the cartridge 40 is prepared by first thoroughly flushing the vial 42 with inert gas to displace air and atmospheric water vapor from the interior of the vial 42. While any inert gas may be used, nitrogen is preferred. As an example and not as a limitation, the vial 42 may be initially sealed with a septum, a nitrogen line is introduced into the vial 42, and an outlet to allow ambient air and moisture to escape out of the vial 42 is provided. The nitrogen supply is then allowed to run for a period of time until the ambient air inside the vial 42 is thoroughly displaced with the inert nitrogen gas. Alternatively, in another embodiment, the vial 42 may be sealed and vacuum pressure may be applied for a period of time to evacuate ambient air and moisture from the interior of the vial 42. Subsequently, after the interior of the vial 42 is completely "dry" of moisture, nitrogen is introduced into the vial 42 to completely fill the interior of the vial 42.

After the interior of the vial 42 is full of nitrogen gas and free of ambient air, the liquid chemical is then precisely measured according to a defined dosage and dispensed into the vial 42 under a nitrogen blanket. After the dispensation of the liquid chemical under nitrogen is complete, the vial 42 is sealed with the barrier 44, which in turn is fastened with the vial cap 46. As an example and not as a limitation, the vial cap 46 may comprise a threaded or a Snap-on metal or hard plastic. As discussed above, the sealed vial 42 is then placed inside the hollow chamber 50, which is designed to fit the vial 42 snug inside the shell 48.

According to another embodiment, the cartridge shell 48 may further comprise a threaded portion 51 near the opening of the hollow chamber 50. A shipping and handling cap 53 having a threaded inside portion that matches the threaded outside portion 51 is provided as an additional protection for the vial 42 during shipment and transfer of the cartridge 40.

The special construction of the cartridge 40 provides a robust protection against harmful vapor release, dangerous chemical spillage, and rapid deterioration of active ingredients due to ambient moisture encountered in the prior art. For example, the hollow chamber 50 and the wall thickness 52 may comprise soft, yet sturdy, durable and leak-proof material such as expanded polypropylene foam, or any other suitable material. According to preliminary tests, the combination of the hard outer surface of the shell 48 and the wall thickness 52 allows the cartridge 40 to withstand an unprotected drop of at least six feet without breaking the vial 42 or spilling the chemical content. Therefore the construction of the cartridge 40 in accordance with the preferred embodiment increases the safety of the operators during a vapor deposition process of a substrate, reduces the need for maximum protective equipment, and provides a safer, easier and more cost-effective method of preparing, shipping and handling of liquid chemicals for substrate coating in a vapor deposition process.

Figure 4A:
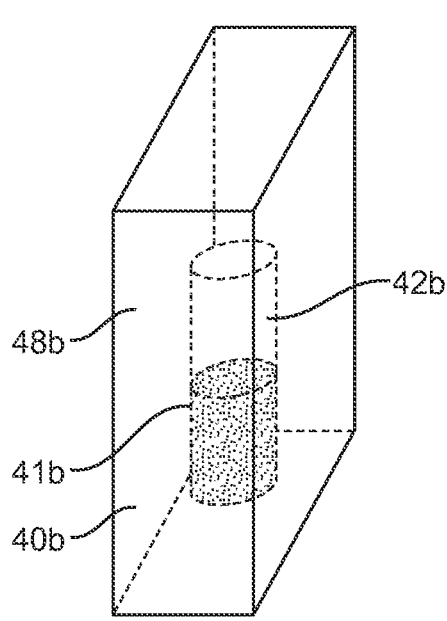
FIGS. 4A and 4B are perspective views of a second preferred embodiment of a cartridge of the chemical introduction system.
Figure 4B:
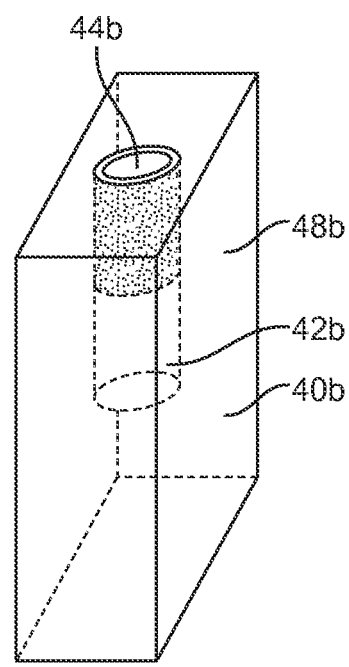
Figure 5:
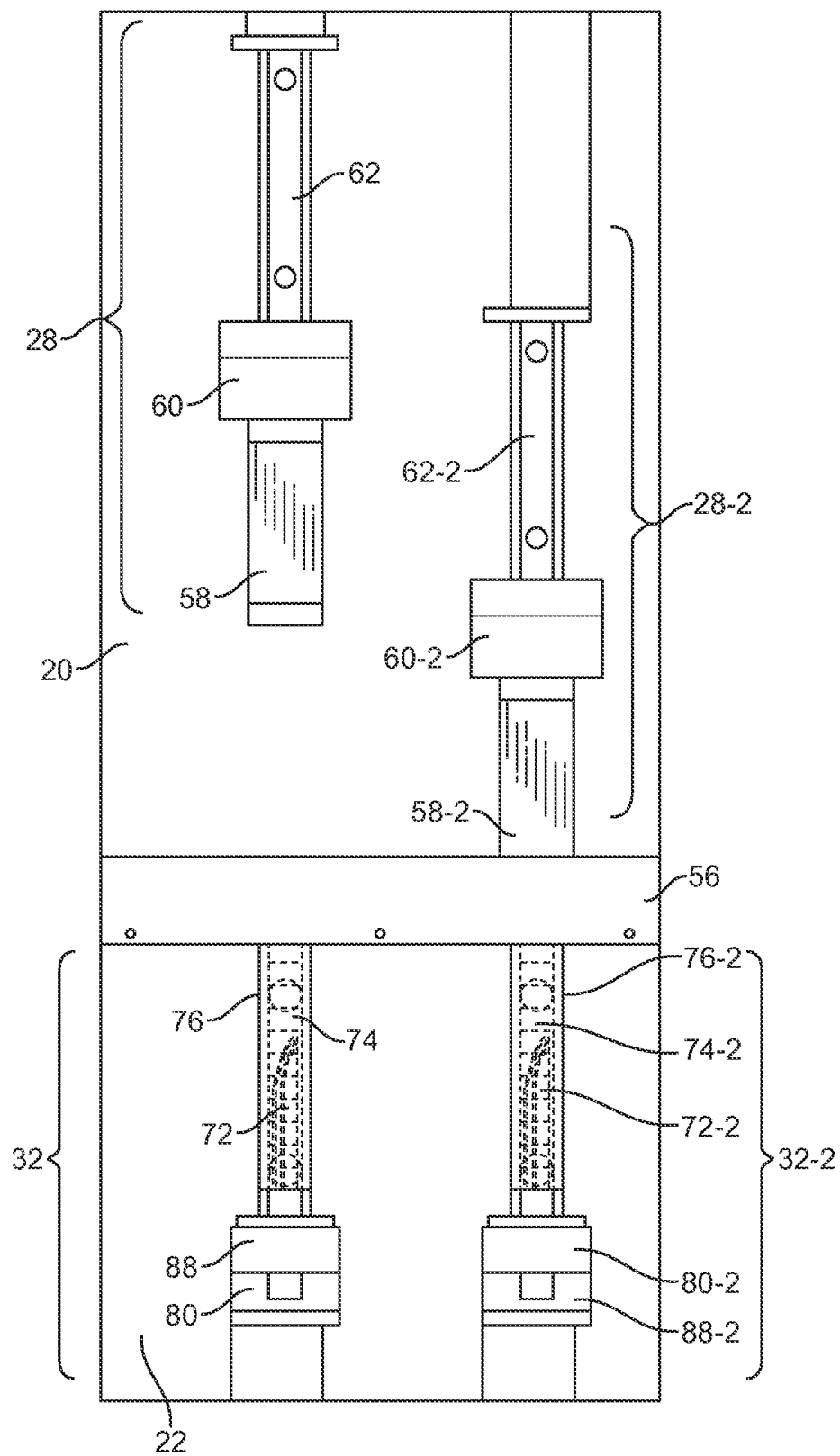
FIG. 5 is a front view of preferred embodiments of a cartridge insertion assembly and a liquid extraction assembly of the chemical introduction system.

As different types of chemicals may be used in a particular chemical vapor deposition process, various cartridge shells 48 having specific shapes for specific chemicals may be used to help distinguish the contents of the cartridges. FIGS. 4A and 4B illustrate another preferred embodiment of the cartridge 40b, where elements of similar structure are designated by the same reference numerals followed by the lower case "b." FIG. 4A illustrates the cartridge 40b facing down and FIG. 4B illustrates the cartridge 40b facing up. In this embodiment, the cartridge 40b comprises a vial 42b containing liquid chemical 41b and a cartridge shell 48b. The vial 42b may comprise a barrier 44b. As shown here, in this second preferred embodiment, the shell 48b preferably has a rectangular shape instead of a cylindrical shape. However, it is to be understood that the cartridge 40 can be of any geometrical shape.

FIGS. 5-10 illustrate the cartridge insertion assembly 28 and the extraction assembly 32 according to a preferred embodiment in greater detail. As shown in FIG. 6A, the cartridge insertion assembly 28 may comprise a cartridge tray 56 having a mounting slot 36 and an upper linear mechanical actuator 60 located above the mounting slot 36 that is movable in a vertical direction along an upper linear mechanical actuator track 62. According to a preferred embodiment, the upper linear mechanical actuator 60 may further comprise a retainer clip 57. The mounting slot 36 has a shape that is designed to receive a matching bottom portion of the cartridge 40. Preferably, the mounting slot 36 may further comprise a mounting slot O-ring to provide additional seal when the cartridge 40 is placed in the mounting slot 36 during the operation of the chemical introduction system 10.

Figure 6A:
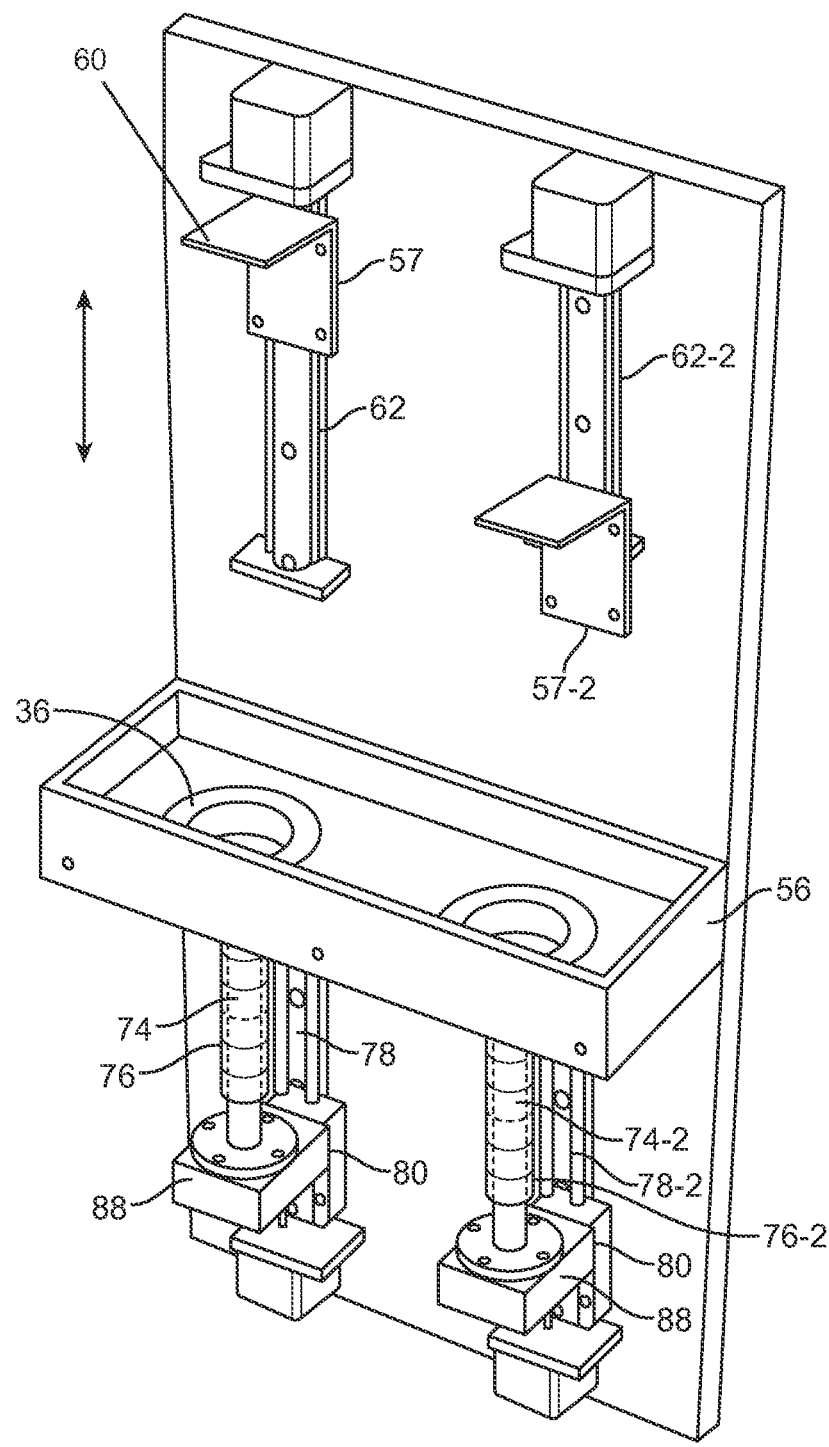
FIG. 6A is a perspective view of the preferred embodiments of the cartridge insertion assembly and the liquid extraction assembly of the chemical introduction system.
Figure 6B:
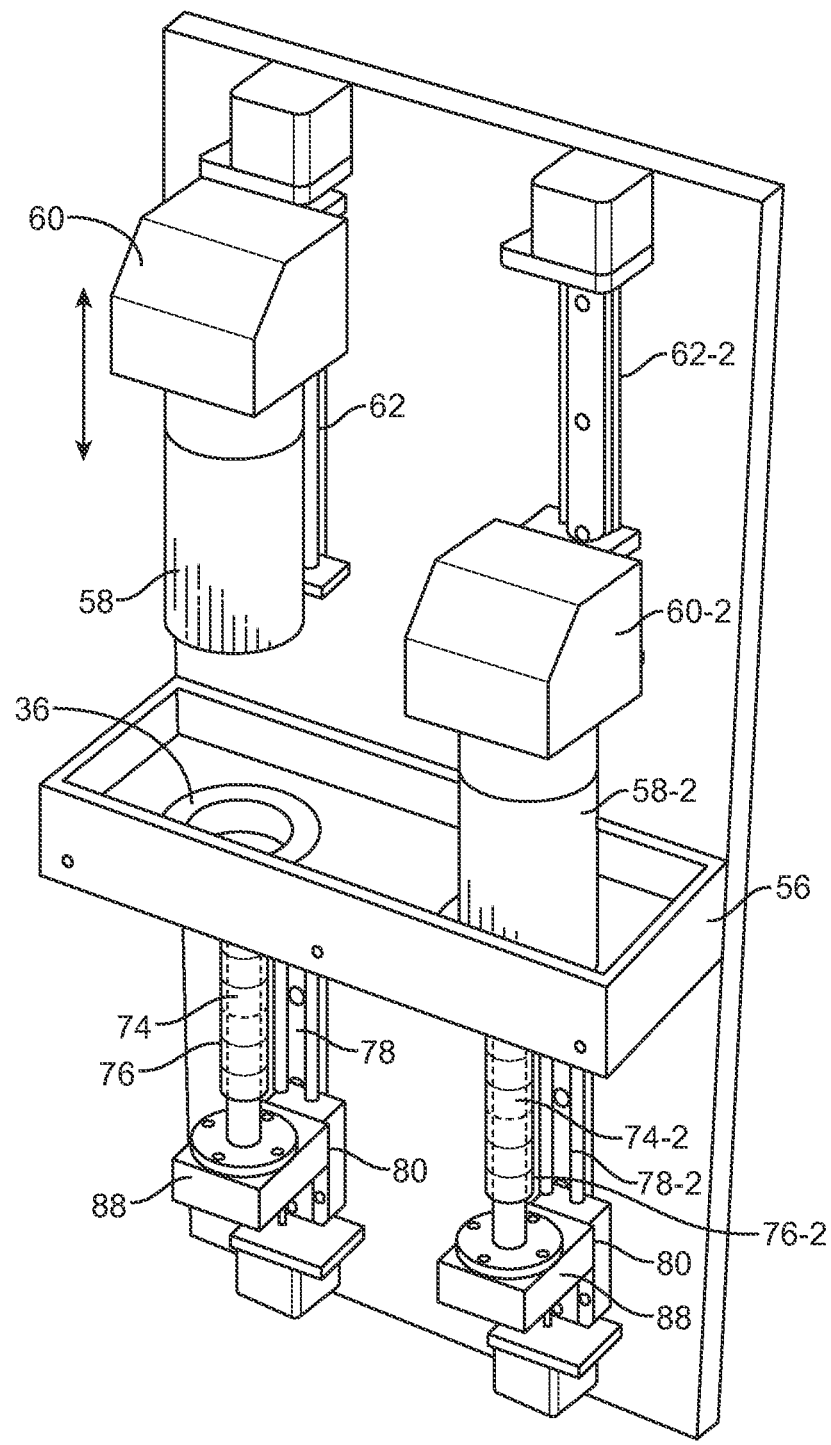
FIG. 6B is a perspective view of alternative embodiments of the cartridge insertion assembly and the liquid extraction assembly of the chemical introduction system.
Figure 7:
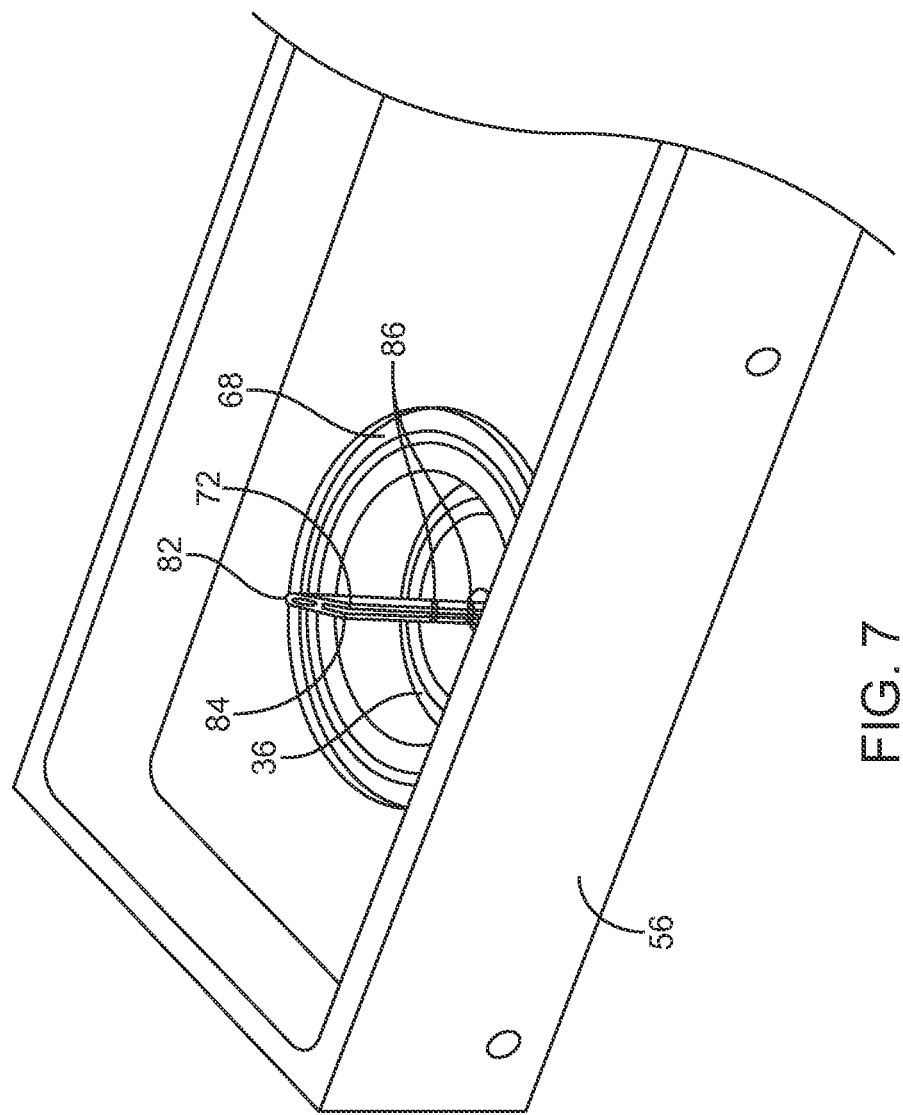
FIG. 7 is a perspective view of a preferred embodiment of a cartridge tray of the cartridge insertion assembly.

In an alternative embodiment, a containment cover 58 may be attached to the upper linear mechanical actuator 60 for additional protection against vapor emission and moisture intrusion. As shown in FIG. 6B, the containment cover 58 may be cylindrical. In the embodiment where the containment cover 58 is provided, the cartridge tray 56 may further comprise a containment cover slot 68 having a shape that matches a bottom portion of the containment cover 58. To optimize chemical vapor containment and sealing against ambient moisture, a containment cover slot O-ring may be provided. As illustrated in FIG. 7, in the embodiment where the containment cover 58 is provided, the mounting slot 36 and the containment cover slot 68 are illustrated as concentric circles that match with the cylindrical first preferred embodiment of the cartridge 40 and the cylindrical containment cover 58. However, it is to be understood that the mounting slot 36 and the containment cover slot 68 can be of any shape having a common center (such as concentric squares, concentric rectangles, etc.) to match a particular shape of the cartridge 40 and the containment cover 58 being used. For example, if the second preferred embodiment of the cartridge 40b as described above is being used, then a mounting slot 36b and a containment cover slot 68b can be concentric squares.

In one embodiment, the upper linear mechanical actuator 60 may be automatically operated by the PLC. In an alternative embodiment, the upper linear mechanical actuator 60 may be manually operated by hand.

Figure 8:
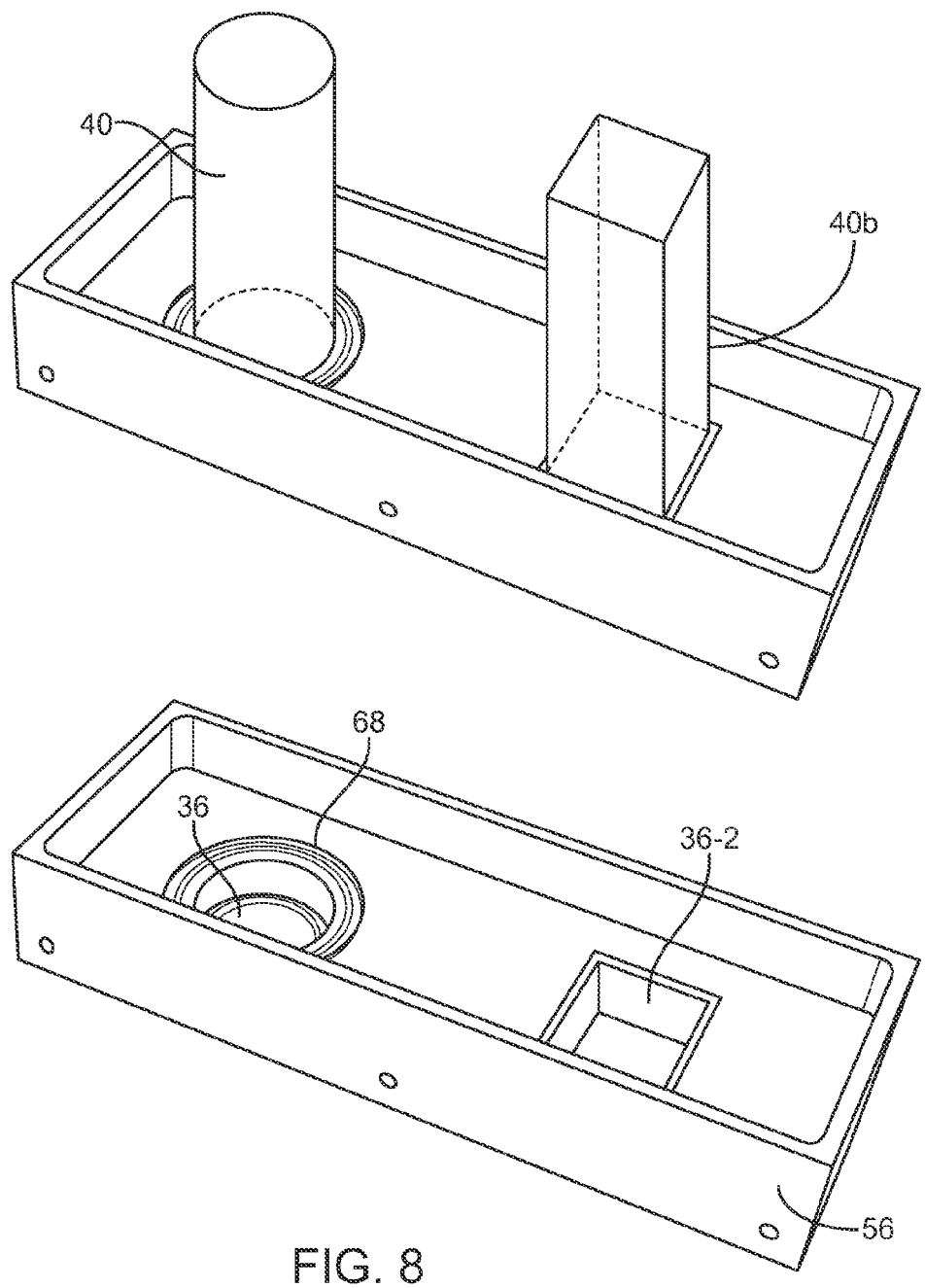
FIG. 8 is a perspective view of a second preferred embodiment of a cartridge tray of the cartridge insertion assembly.

Further, as shown in FIG. 8, in an embodiment where at least two types of chemicals are used in a vapor deposition process and the chemicals are contained in at least two different types of cartridges 40, the cartridge tray 56 may comprise a plurality of mounting slots 36 and a plurality of containment cover slots 68 of various shapes. As an example and not as a limitation, FIG. 8 illustrates the cylindrical cartridge 40 being mounted on the circular mounting slot 36 and the rectangular cartridge 40b being mounted on a second mounting slot 36-2. The use of a specific type of cartridge 40 for a specific type of chemical, wherein a particular shape of the cartridge 40 can only be received by a matching mounting slot 36, helps the operator distinguish one type of liquid chemical from another, and thus reduces human error.

Figure 9:
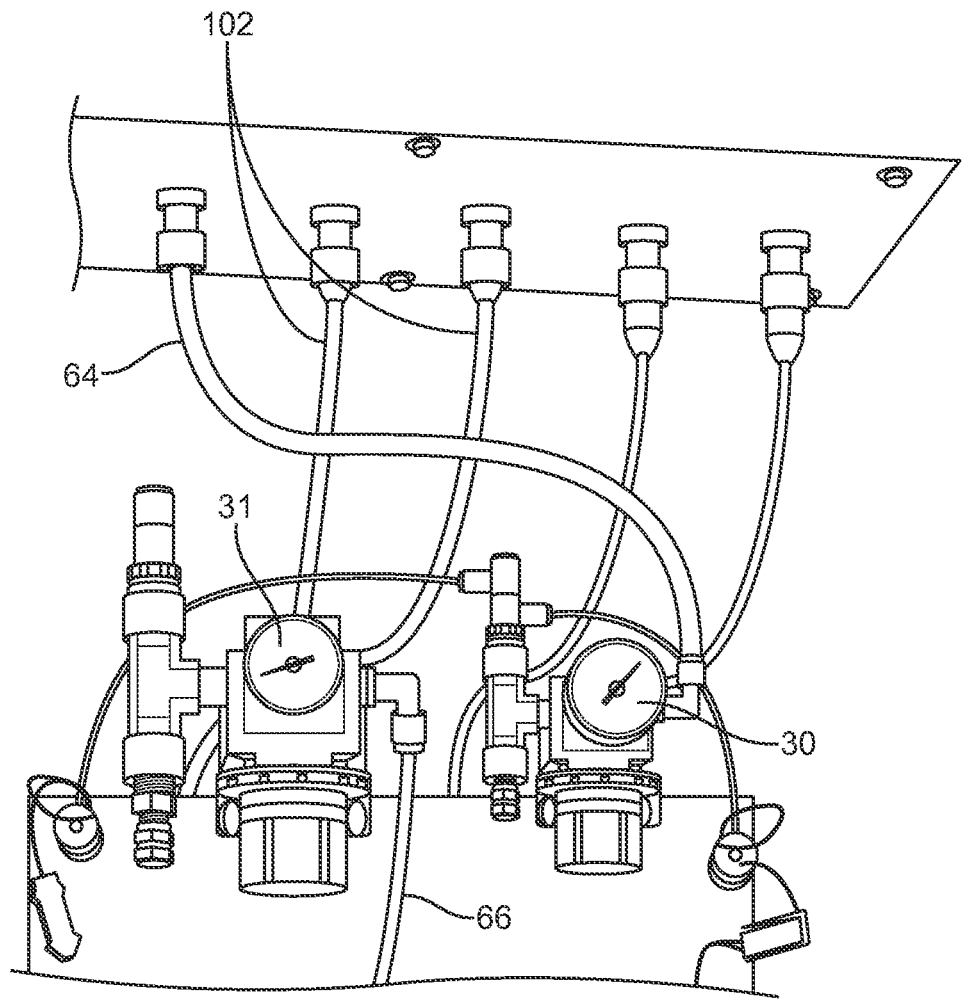
FIG. 9 is a front view of preferred embodiments of a nitrogen line and a compressed air line of the chemical introduction system.

In FIG. 9, a main nitrogen line 64 that supplies nitrogen to the entire chemical introduction system 10 and a main compressed air line 66 that supplies compressed air to the vaporization assembly 34 are provided above the cartridge insertion assembly 28. In a preferred embodiment, the flow of the main nitrogen line 64 is regulated by the nitrogen gauge valve 30. The nitrogen gauge valve 30 controls nitrogen pressure and further splits nitrogen supply into a number of nitrogen sub lines that supply nitrogen to a plurality of cartridge insertion assemblies 28 and a plurality of extraction assemblies 32. Similarly, the main compressed air line 66 is regulated by the compressed air gauge valve 31, which controls compressed air pressure and splits compressed air supply to a plurality of vaporization assemblies 34. FIG. 9 also illustrates a plurality of chemical vapor outlets 102, which deliver chemical vapors containing active ingredients to a treatment chamber of the chemical vapor deposition system, discussed in further details below.

Referring to FIGS. 5-7 and 10-11, the extraction assembly 32 preferably comprises a lower linear mechanical actuator 80 movable in a vertical direction along a lower linear mechanical actuator track 78, an extraction lance 72 attached to the lower linear mechanical actuator 80, a ridged sleeve 74 covering the extraction lance 72 and a chemical collection block 88 to collect extracted liquid chemical. According to one embodiment, the lower linear mechanical actuator 80 may be automatically operated by the PLC. In another embodiment, the lower linear mechanical actuator 80 may be manually operated by hand. The extraction lance 72 is vertically movable within the ridged sleeve 74. The ridged sleeve 74 provides a containment protection to ensure that no harmful vapors from the active ingredients escape during the extraction process. In an alternative embodiment, a bellow 76 may be further provided to cover the ridged sleeve 74 and add another layer of fume containment.

Figure 10:
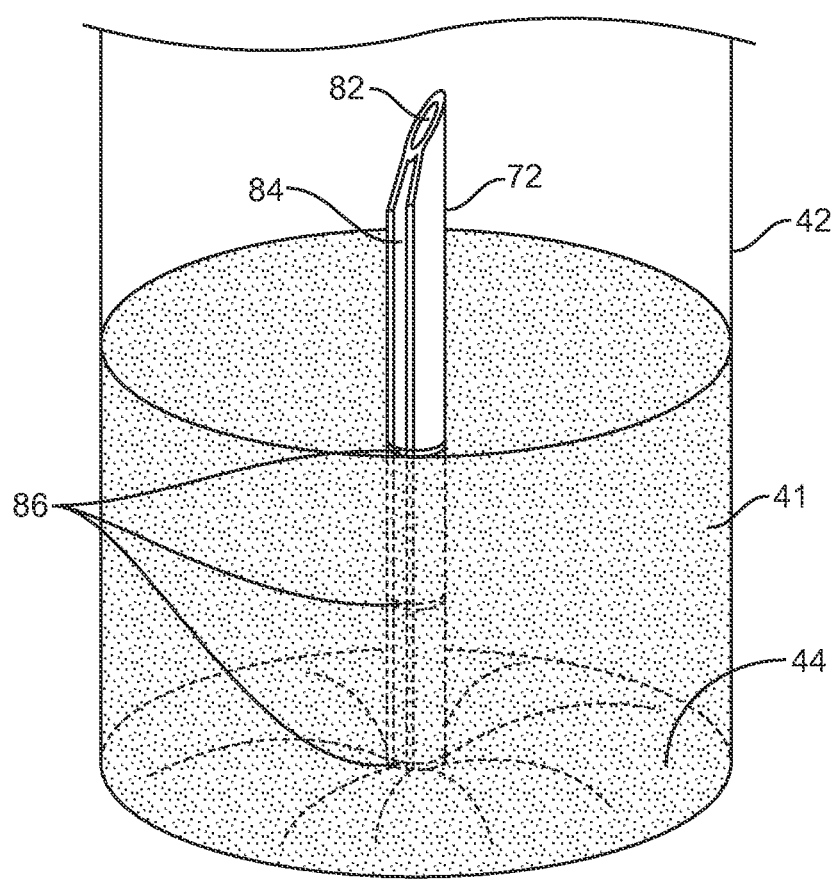
FIG. 10 is a perspective, close up view of a preferred embodiment of an extraction lance of the liquid extraction assembly.

As shown in FIG. 10, the extraction lance 72 preferably further comprises a central lumen 82, a vertical groove 84, and at least a circumferential groove 86. The central lumen 82 allows nitrogen to be supplied into the vial 42 during the extraction process. The vertical groove 84 allows extracted liquid to drain down into the chemical collection block 88 below. The circumferential groove 86 catches the barrier 44 at the penetration point during extraction. During operation, the lower mechanical actuator reverses a few millimeters in a downward direction after the initial puncture of the barrier 44. Consequently, the circumferential groove 86 slightly pulls down the barrier 44 to form a funnel shape for optimum collection of chemical in the cartridge 40. In one embodiment, the extraction lance 72 may comprise two circumferential grooves 86.

Figure 11:
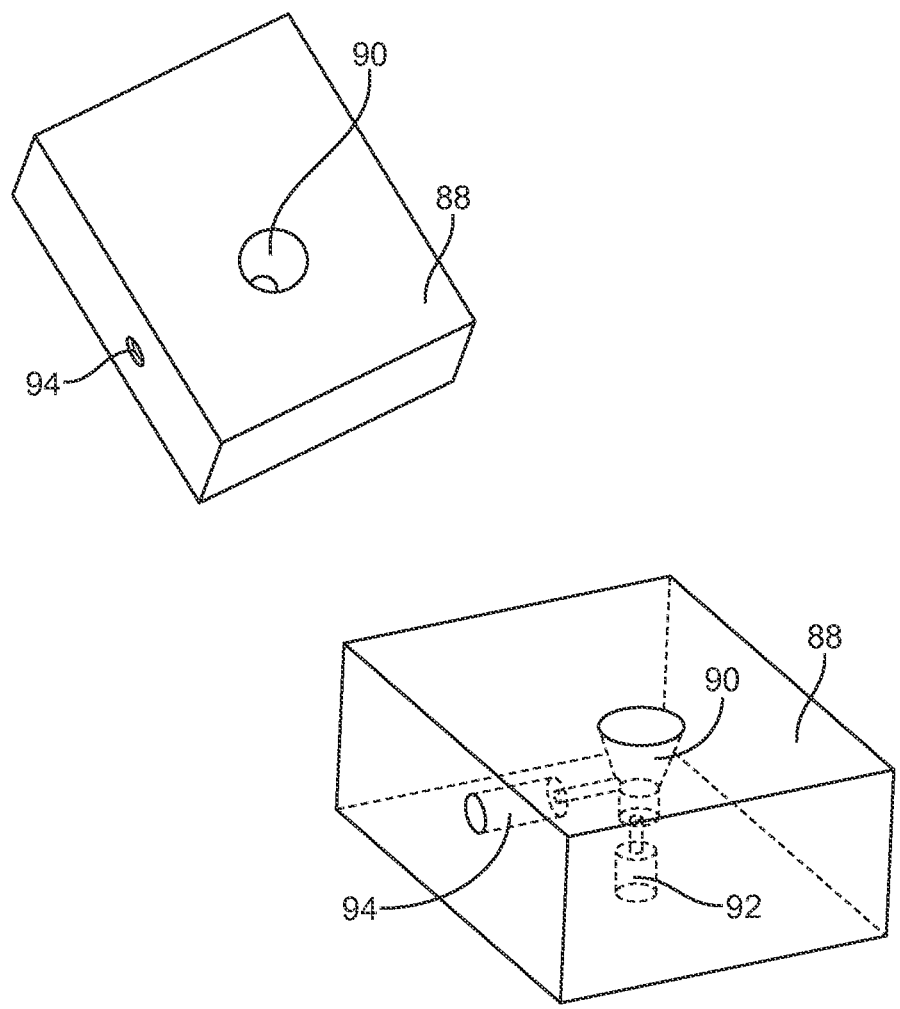
FIG. 11 is a perspective view of a preferred embodiment of a chemical collection block of the liquid extraction assembly.

FIG. 11 illustrates the chemical collection block 88 according to a preferred embodiment. The chemical collection block 88 further comprises a liquid collection chamber 90, a nitrogen line 92 and a liquid inlet 94 that directs extracted chemical to the vaporization assembly 34. The nitrogen line 92 supplies nitrogen pressure into the vial 42 to assist with the liquid extraction. Preferably, the liquid collection chamber 90 has an inverted conical shape to ensure complete collection of extracted liquid chemical from the cartridge 40.

Figure 12:
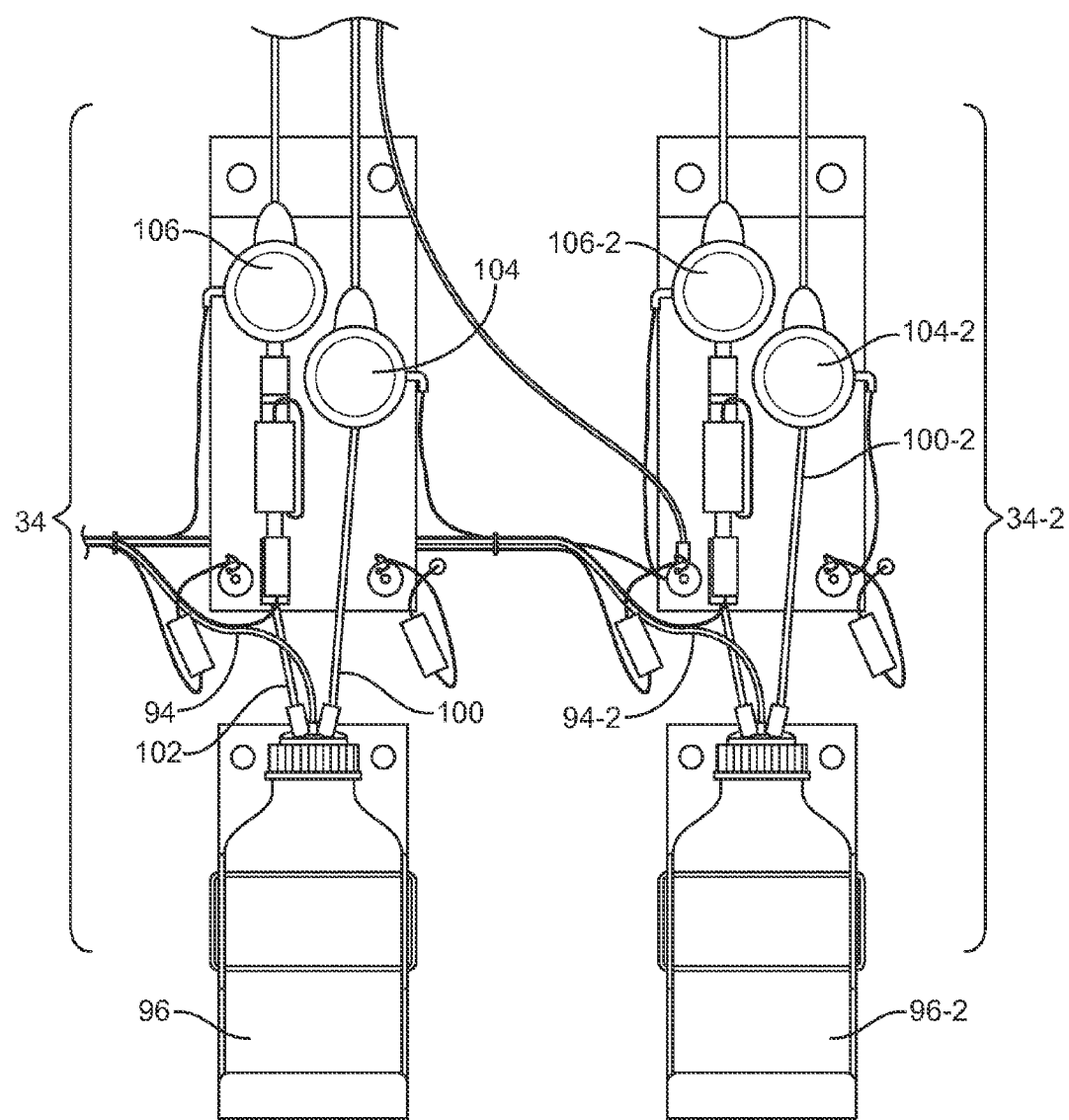
FIG. 12 is a front view of a preferred embodiment of a vaporization assembly of the chemical introduction system.

FIG. 12 illustrates a preferred embodiment of the vaporization assembly 34. Here, the vaporization assembly 34 further comprises a vaporization chamber 96, a compressed air supply 100, the chemical vapor outlet 102 that delivers active chemical vapors from the vaporization chamber 96 to the treatment chamber of the chemical vapor deposition system, a compressed air valve 104 to regulate the flow of compressed air pressure going into the vaporization chamber 96, and a vapor pressure valve 106 to regulate the flow of chemical vapors from the vaporization chamber 96 to the treatment chamber. Extracted liquid chemical is delivered from the collection chamber 90 into the vaporization chamber 96 through the liquid inlet 94. In one aspect, a plurality of vaporization assemblies 34 may be provided to allow vaporization of a plurality of liquid chemicals and delivery of the resulting vapors to the treatment chamber at the same time. As an example and not as a limitation, FIG. 12 illustrates a second vaporization assembly 34-2, where elements of similar structure are designated by the same reference numerals followed by the "-2."

Figures 13A, 13B:
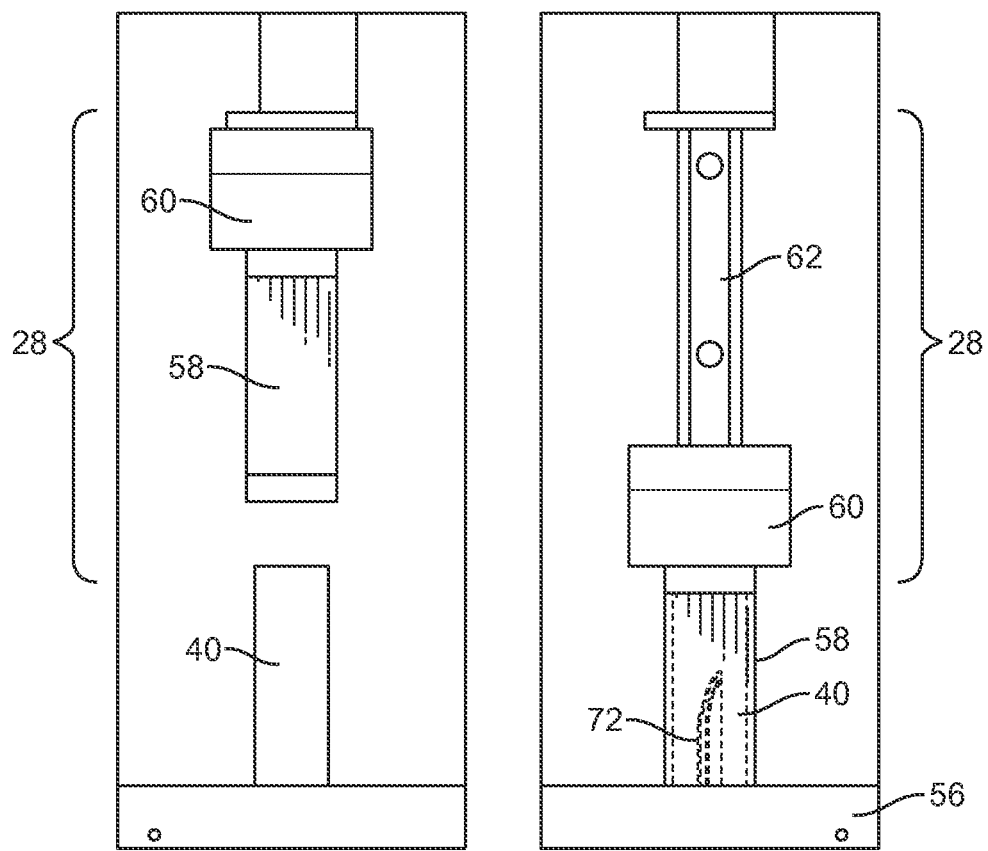
FIGS. 13A and 13B are front views of the preferred embodiment of the cartridge insertion assembly before and after the chemical introduction system is initiated.
Figures 14A, 14B:
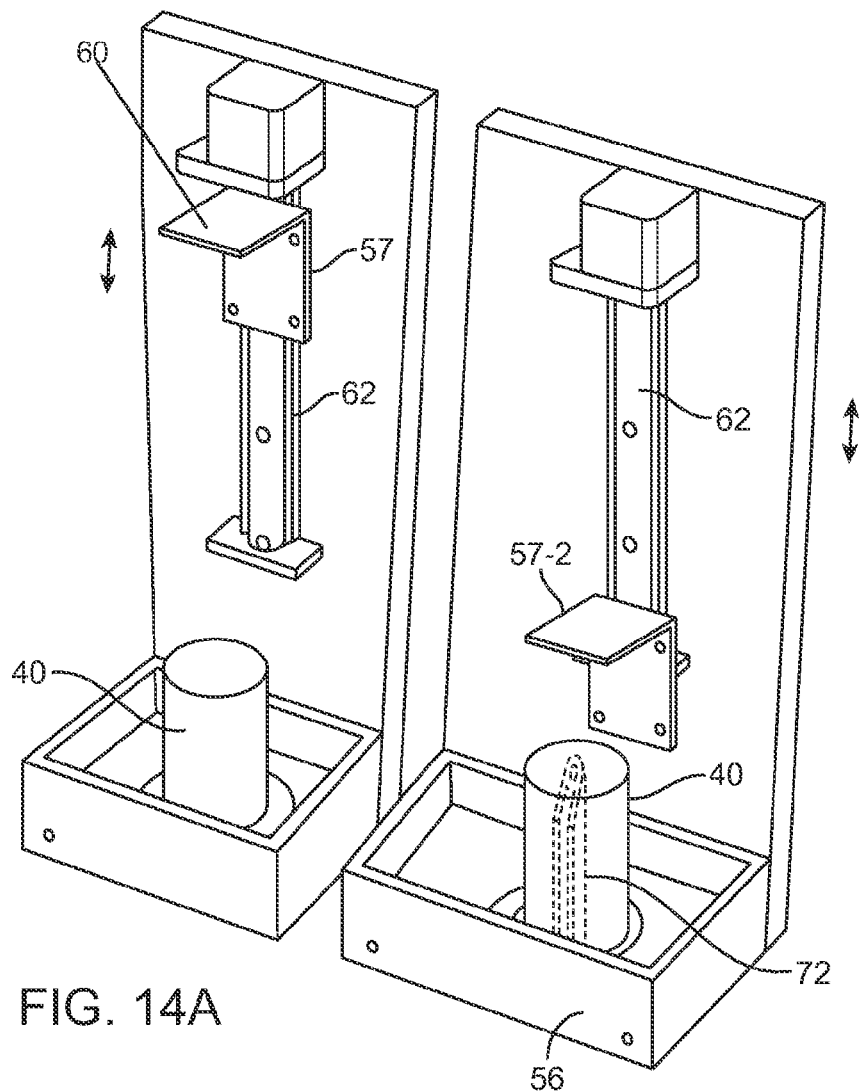
FIGS. 14A and 14B are perspective views of the preferred embodiments of the cartridge insertion assembly before and after the chemical introduction system is initiated.
Figures 14C, 14D:
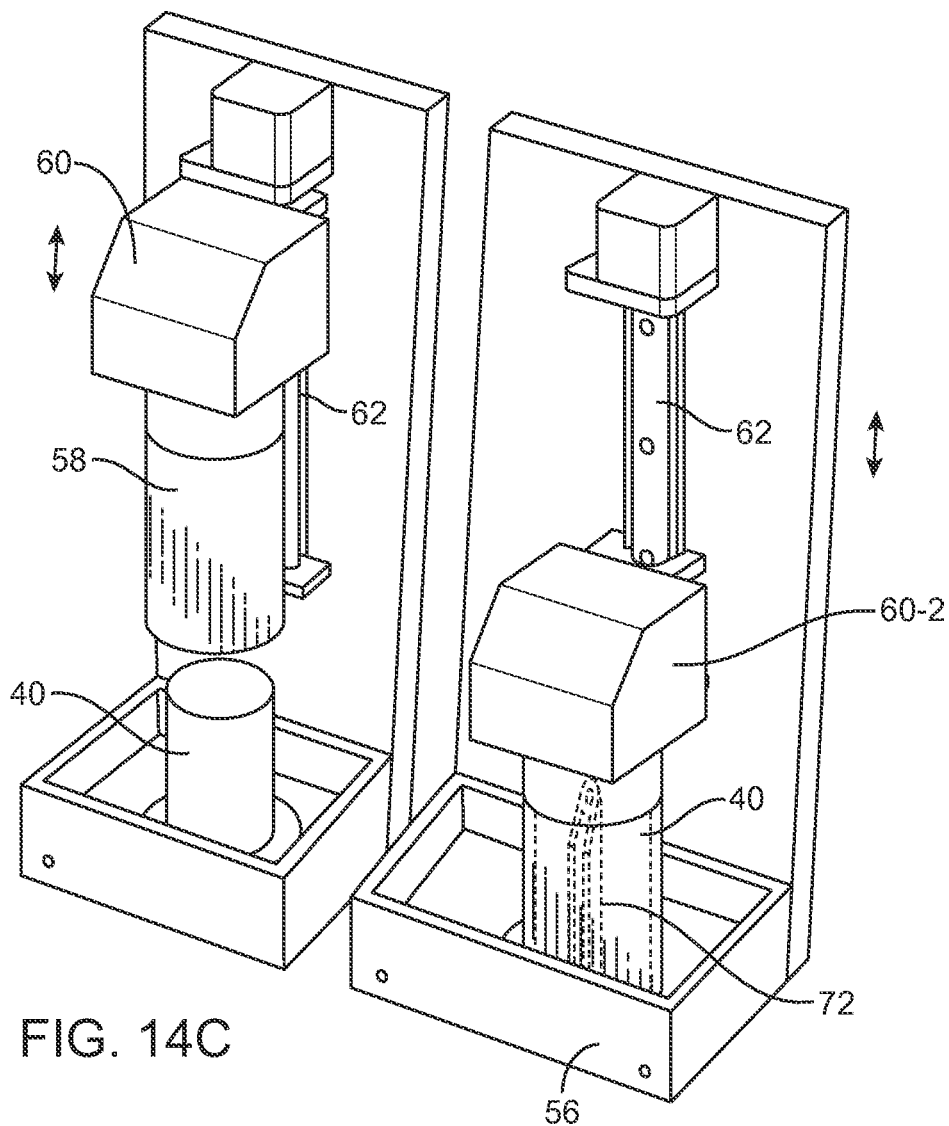
FIGS. 14C and 14D are perspective views of alternative embodiments of the cartridge insertion assembly before and after the chemical introduction system is initiated.
Figures 15A, 15B:
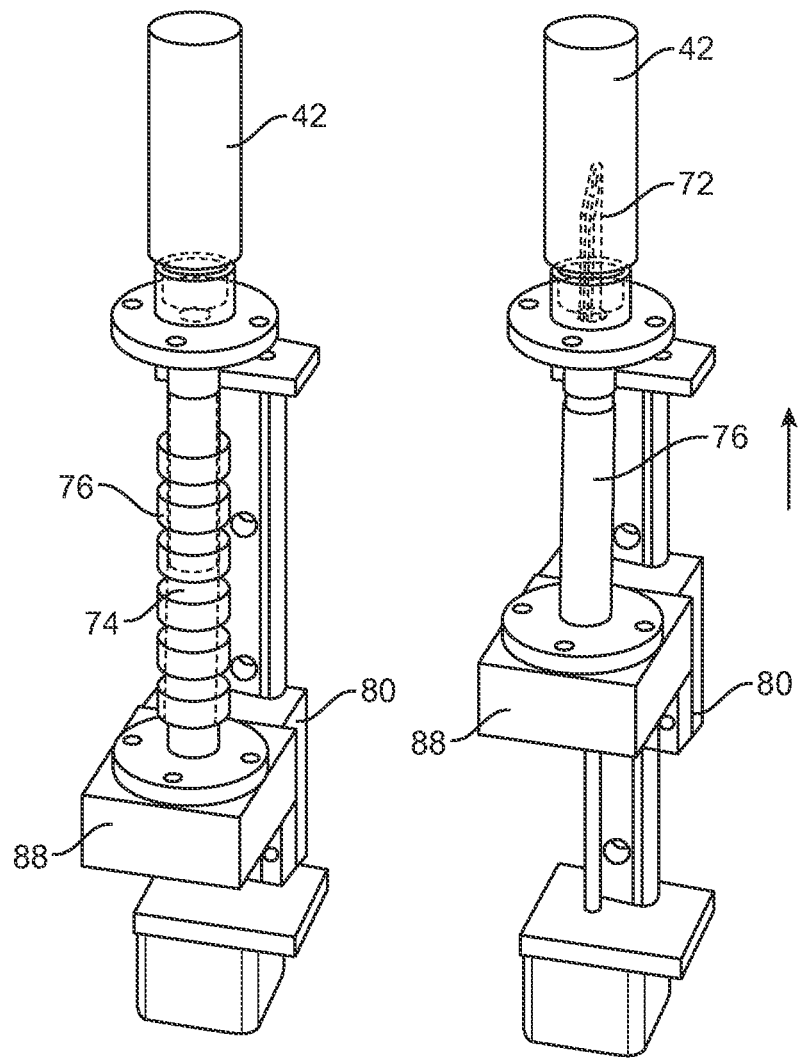
FIGS. 15A and 15B are perspective views of the preferred embodiment of the extraction assembly before and after the chemical introduction system is initiated.

Having described the various components of the chemical introduction system 10 in greater details, the preferred principles of operation of the chemical introduction system 10 can now be further understood by referring to the following description and FIGS. 13-15. FIGS. 13A and 13B show a front view of the cartridge insertion assembly 28, before and after the chemical introduction system 10 is initiated. FIGS. 14A-14D show a perspective view of the cartridge insertion assembly 28, before and after the chemical introduction system 10 is initiated. FIGS. 15A and 15B show a perspective view of the extraction assembly 32, before and after the chemical introduction system 10 is initiated.

Prior to initiating the chemical introduction system 10, the cartridge 40 is inserted into the matching mounting slot 36 inside the liquid chemical delivery compartment 14 with the barrier 44 face down. After the cartridge 40 is properly inserted into the mounting slot 36, the operator then closes the cartridge compartment door 24 and initiates both the chemical introduction system 10 and the chemical vapor deposition system by using the touch screen control module 18. The PLC provides the operator with the option to run the systems according to a preset automated program or a manual program by controlling certain parameters, such as stage runtimes, and so forth.

The chemical vapor deposition process requires the surface of the substrate to contain an effective amount of moisture to react with the active ingredients to form a film coating. Hence, according to a preferred embodiment, the chemical vapor deposition system and the chemical introduction system 10 are initiated simultaneously. First, a substrate to be coated is placed in the treatment chamber of the chemical vapor deposition system. A hygrometer may be provided to first measure the ambient humidity prior to treating the substrate with the active ingredient. Upon receiving the humidity data from the hygrometer, the PLC then calculates a proper runtime to introduce humidity to the treatment chamber based on a predetermined formula. Subsequently, the PLC then engages a humidifier to inject moisture into the treatment chamber according to the predetermined runtime. After the humidification stage is complete, the PLC then evacuates the ambient air from the treatment chamber to remove as much airborne moisture as possible, leaving only moisture on the substrates for further chemical treatment.

Simultaneous with the initiation of the chemical vapor deposition system, the PLC initiates the program on the chemical introduction system 10. As shown in FIGS. 14A and 14B, the upper linear mechanical actuator 60 begins to move in a downward direction along the upper linear mechanical actuator track 62 to allow the retainer clip 57 to securely hold down the cartridge 40 in the mounting slot 36 during the chemical extraction process. In the embodiment where the clear containment cover 58 is provided, as illustrated in FIGS. 14C and 14*d*, the clear containment cover 58 securely holds down the cartridge 40 in the mounting slot 36 during the chemical extraction process and provides an airtight seal against incoming moisture and emission of harmful chemical vapor.

According to a preferred embodiment, the cartridge insertion assembly 28 may further include a pressure sensor to detect air leak. If the pressure sensor detects a leak, the pressure sensor will report the leak to the control system. If the leak is outside the operating perimeters of the system, the PLC will retract the upper linear mechanical actuator 60 slightly and then move it again in a downward direction in an attempt to reseat the cartridge 40. The pressure sensor will be employed again to determine any leaks. If none is found, the process will proceed. If one is found, the process will stop and an error code will be indicated on the touch screen control module 18. Further, in the embodiment that utilizes the clear containment cover 58, nitrogen is supplied into the clear containment cover 58 according to a predetermined time to further drive out moisture and ensure an airtight seal. Once this step is complete, the chemical introduction system 10 will wait until the humidification step in the treatment chamber of the chemical vapor deposition system is complete.

After the humidification process in the treatment chamber is complete, the chemical introduction system 10 is now ready to perform the extraction of the liquid chemical from the cartridge 40. After conducting humidification for the proper time as determined by the hygrometer reading and a predetermined formula, the PLC then initiates the lower linear mechanical actuator 80 to move in an upward direction along the lower linear mechanical actuator track 78 and raise the attached extraction lance 72 until it penetrates the resealing septum 44 of the cartridge 40. Once the extraction lance 72 has completely penetrated the resealing septum 44, inert gas, preferably nitrogen, is supplied through the central lumen 82 of the extraction lance 72. The combination of gravity and nitrogen pressure forces the liquid chemical inside the vial 42 to drain down through the vertical groove 84 into the liquid collection chamber 90 inside the collection block 88. During this extraction process, the ridged sleeve 74 provides a containment system to prevent emission of the liquid chemical and its vapors. In an alternative embodiment, the bellow 76 may be further provided to cover the ridged sleeve 74. As described above and shown in FIG. 10, the circumferential groove 86 of the extraction lance 72 catches the penetration point of the barrier 44 and slightly pulls down the barrier 44 to form a funnel to ensure complete collection of the liquid chemical.

The chemical collection block 88 directs the extracted chemical and its vapors to the vaporization chamber 96 through the liquid inlet 94. Once the liquid chemical is collected in the vaporization chamber 96, compressed air is drawn across the chemical to evaporate the liquid and carry the vapors into the treatment chamber of the chemical vapor deposition system. The flow of compressed air going into the vaporization chamber 96 is regulated by the compressed air valve 104 and the compressed air gauge valve 31. The flow of chemical vapor that is going from the vaporization chamber 96 into the treatment chamber of the chemical vapor deposition system is controlled by the vapor pressure valve 106.

Figure 16:
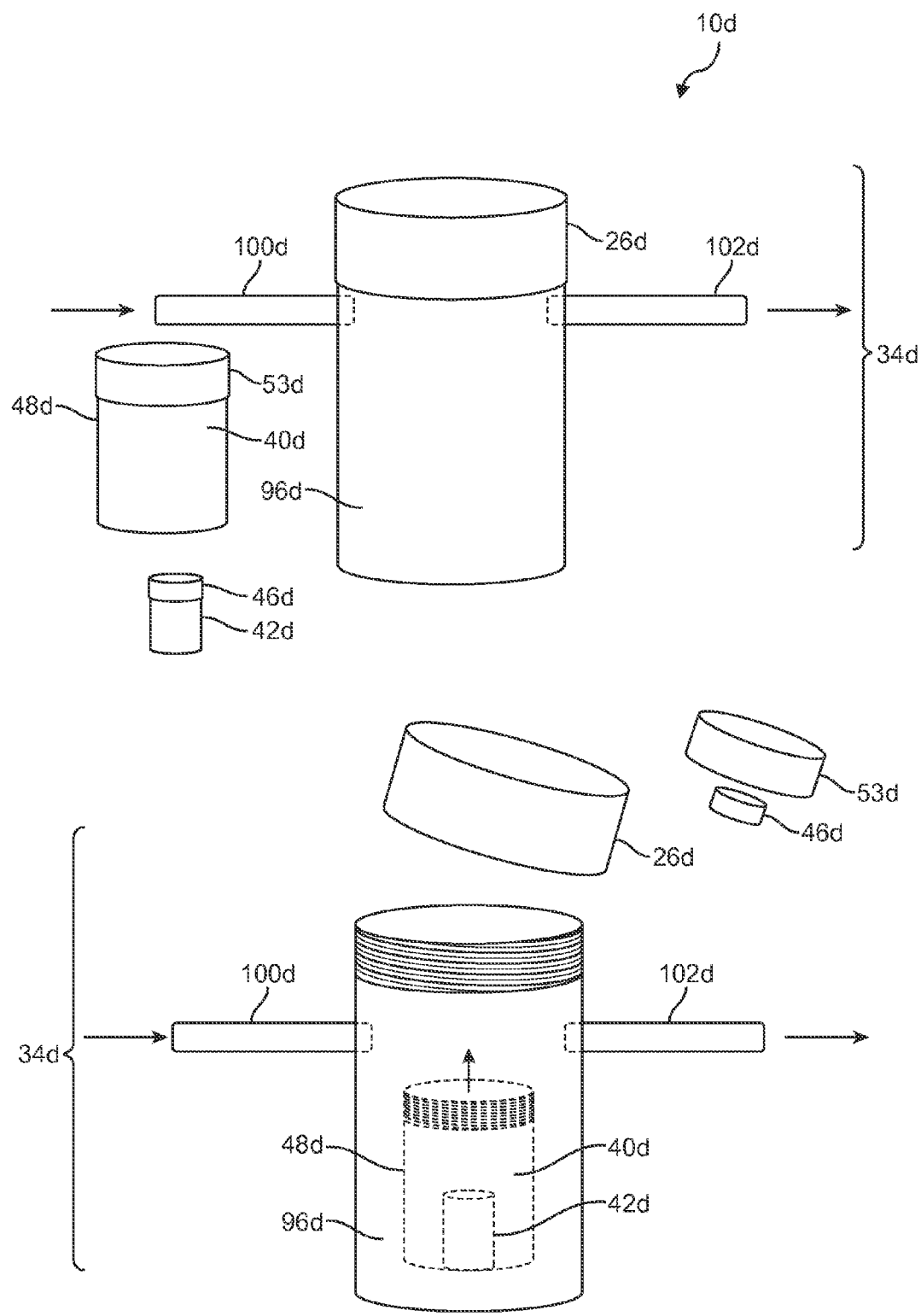
FIG. 16 is a perspective view of an alternative embodiment of a chemical introduction system.

FIG. 16 illustrates an alternative embodiment of a chemical introduction system 10*d* for a chemical deposition process on a substrate that does not require the cartridge insertion assembly 28 and the extraction assembly 32. In this alternative embodiment, a sealed cartridge 40*d* containing a defined dosage of active ingredient for the chemical deposition process may comprise a moisture-free vial 42*d*, a low-transmission inner cap 46*d* to seal the opening of the vial 42*d*, a cartridge shell 48*d* and an outer cap 53*d* to seal the opening of the cartridge shell 48*d*. In one embodiment, the inner cap 46*d* and the outer cap 53*d* may be threaded. The required active ingredient is dispensed into the vial 42*d*, and the vial 42*d* is subsequently placed inside the cartridge shell 48*d*. The cartridge 40*d* may be prepared according to the preferred embodiments described above to ensure that its interior is free of ambient moisture.

In this embodiment, a vaporization assembly 34*d* comprising a vaporization chamber 96*d*, a vaporization chamber cap 26*d*, a compressed air supply 100*d* and a chemical vapor outlet 102*d* is provided. In one embodiment, the vaporization chamber 96*d* may be cylindrical, wherein the exterior of its opening is threaded to match the inside thread of the vaporization chamber cap 26*d* for an airtight seal. However, it is to be understood that any geometric shape can be used for the vaporization chamber 96d.

The chemical introduction system 10d is initiated by removing the outer cap 53d and the inner cap 46d from the cartridge 40d to expose the liquid chemical, removing the vaporization chamber cap 26d, and placing the cartridge 40d inside the vaporization chamber 96d. Subsequently, the vaporization chamber 96d containing the open cartridge 40d is resealed with the vaporization chamber cap 26d. Compressed air is then supplied into the vaporization chamber 96d through the compressed air supply line 100d to evaporate the liquid chemical and carry the vapors containing the active ingredients into the treatment chamber of the chemical vapor deposition system through the outlet 102d.

From the chemical introduction system 10, or alternatively the chemical introduction system 10d, the chemical vapors enter the treatment chamber of the chemical vapor deposition system. According to a preferred embodiment, upon entering the treatment chamber, the active ingredients in the vapors react with the moisture on the surface of the substrate or the elements within the substrate (such as silica within glass, metal oxide within steel or silica dioxide coating which was pre-applied to the substrate) to create a film coating on the substrate. In one embodiment, the air within the treatment chamber is circulated according to a predetermined time using a specially designed fan and tubing system to ensure an ideal amount of air turbulence to optimize the vapor deposition process. After the vapor deposition process is complete, any remaining chemical vapor and airborne byproducts are evacuated through an air-scrubber that filters the air and neutralizes any airborne acid. In one aspect, the air scrubber comprises a particle filter and a series of trays filled with an acid-absorbing or neutralizing media. The resulting output from the air scrubber is a pH neutral air that contains no harmful elements.

Figure 17:
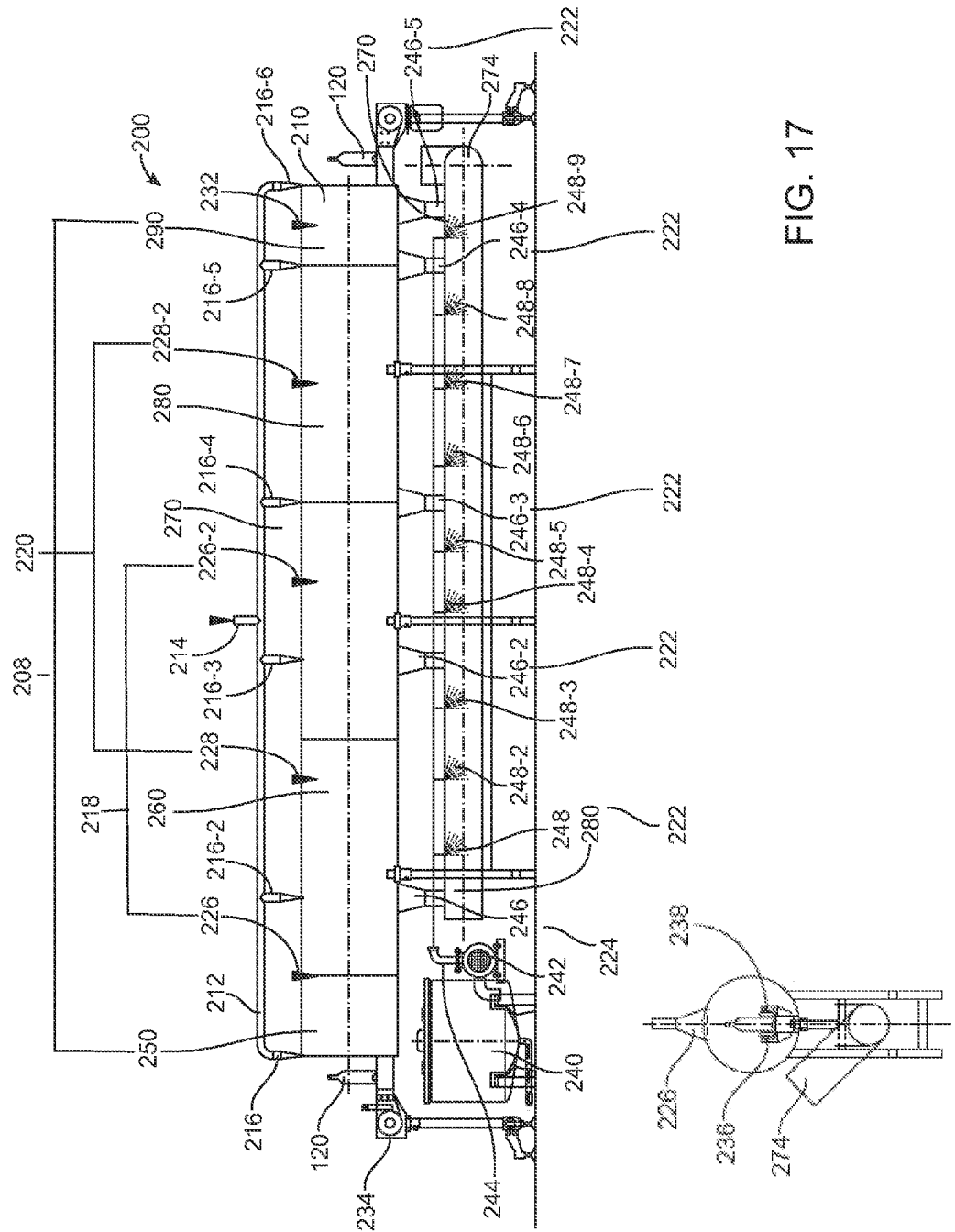
FIG. 17 is a side view of a preferred embodiment of a conveyance chemical vapor deposition system.
Figure 18:
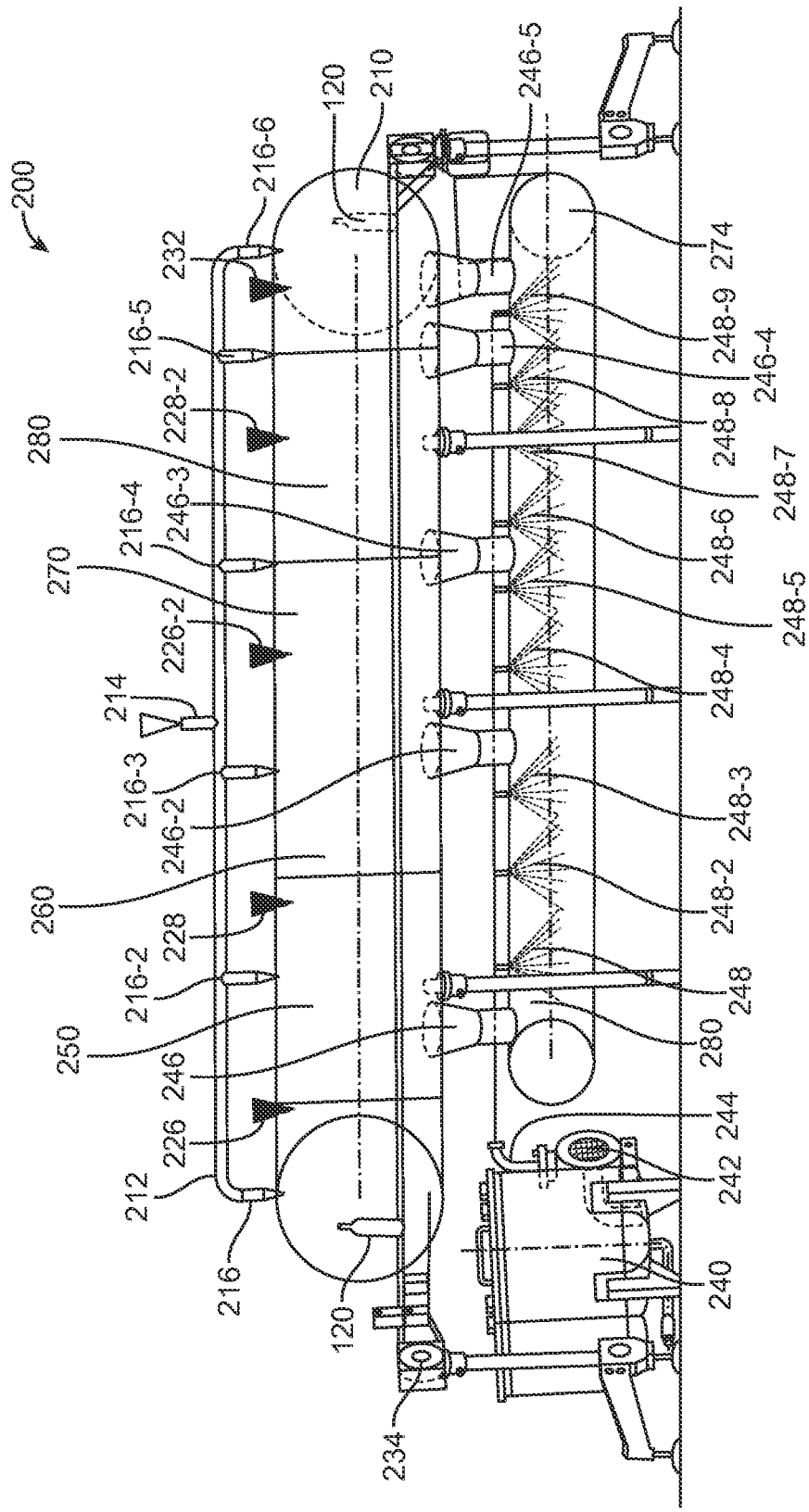
FIG. 18 is a perspective view of the preferred embodiment of the conveyance chemical vapor deposition system.

FIGS. 17 and 18 illustrate a front view, a side view and a perspective view of one embodiment of the chemical vapor deposition system designated by a reference numeral 200, which includes a conveyance, assembly line type of system inside a fully contained chamber. The conveyance line may include, but not limited to, a conveyor belt, a basket, a carrier or any suitable in-line processing mechanism. The chemical vapor deposition system 200 may be used in conjunction with, or alternatively independent of, the chemical introduction system 10 described above. In the embodiment that uses the chemical vapor deposition system 200 in conjunction with the chemical introduction system 10, defined dosages of active ingredients contained in the cartridges 40 for a single run of a predetermined duration are used. On the other hand, in the embodiment that does not use the chemical vapor deposition system 200 in conjunction with the chemical introduction system 10, the active ingredients may be introduced manually. It is to be understood that the chemical vapor deposition process according to either embodiment is performed continuously under ambient temperature and pressure.

As shown in FIGS. 17 and 18, the chemical vapor deposition system 200 preferably comprises a conveyor belt 234, a treatment chamber 210, a compressed clean air system 208, a water vapor system 218, a chemical vapor system 220, a vacuum system 222 to evacuate unreacted active ingredients and acidic by-products, and a neutralization system 224 connected to the vacuum system 222 to receive and neutralize the acidic byproducts before the carrying air is released to the environment. In one embodiment, the treatment chamber 210 may be cylindrical.

The compressed clean air system 208 may further comprise a central air source 214, a main air duct 212 and a plurality of air curtains 216, where elements of similar structure are designated by the same reference numerals followed by consecutive numberings such as "-2," "-3," "-4" and so forth.

The water vapor system 218 may further comprise a plurality of water vapor inlets 226, where elements of similar structure are designated by the same reference numerals followed by consecutive numberings such as "-2," "-3," "-4" and so forth. The water vapor system 218 is preferably placed above and along the conveyor belt 234 inside the treatment chamber 210.

Similarly, the chemical vapor system 220 may further comprise a plurality of chemical vapor inlets 228 placed above and along the length of the conveyor belt 234 inside the treatment chamber 210, where elements of similar structure are designated by the same reference numerals followed by consecutive numberings such as "-2," "-3," "-4" and so forth. The plurality of water vapor inlets 226 and the plurality of chemical vapor inlets 228 may be configured in an alternating fashion separated by the plurality of air curtains 216, according to the desired coating process, which will be discussed in further details below.

The vacuum system 222 may further comprise a plurality of vacuum channels 246, where elements of similar structure are designated by the same reference numerals followed by consecutive numberings such as "-2," "-3," "-4" and so forth. In a preferred embodiment, the vacuum channels 246 are placed below and along the length of the conveyor belt 234, and further connected to the neutralization system 224. The neutralization system 224 may comprise a neutralizing solvent reservoir 240, a vapor duct 280 connected to the plurality of vacuum channels 246, a plurality of solvent inlets 248 inside the vapor duct 280, and a reservoir pump 242 that draws the neutralizing solvent from the solvent reservoir 240 and delivers it to the plurality of basic solvent inlets 248. In an alternative embodiment, the neutralization system 224 may comprise an air scrubber that further comprises a particle filter and a series of trays containing acid absorbing and neutralizing media (not pictured).

As shown in FIGS. 17 and 18, the interior of the cylindrical treatment chamber 210 is divided into multiple compartments by the plurality of clean air curtains 216 placed above and along the conveyor belt 234, to prevent cross-contamination between moisture and chemical vapors. According to a preferred embodiment, compressed clean air is supplied from the central air source 214 and distributed to the plurality of air curtains 216 through the main air duct 212. Each air curtain 216 forms a barrier that prevents vapors from one area to travel to another area within the treatment chamber 210. As illustrated, a first compartment 250 may comprise a first water vapor inlet 226 placed in between a first air curtain 216 and a second air curtain 216-2, a second compartment 260 may comprise a first chemical vapor inlet 228 placed in between the second air curtain 216-2 and a third air curtain 216-3, a third compartment 270 may comprise a second water vapor inlet 226-2 placed in between the third air curtain 216-3 and a fourth air curtain 216-4, a fourth compartment 280 may comprise a second chemical vapor inlet 228-2 placed in between the fourth air curtain 216-4 and a fifth air curtain 216-5, and a fifth compartment 290 may comprise a compressed air nozzle 232 placed in between the fifth curtain 216-5 and a sixth air curtain 216-6.

Having described the various components of the conveyance chemical vapor deposition system 200 in greater details, a preferred method for creating film coatings on a substrate in a closed chemical vapor deposition system is now provided. In summary, according to a preferred embodiment, a substrate to be treated is placed on the conveyor 234 and moved along a series of water and chemical vapor deposition treatment inside the treatment chamber 210. The treatment chamber 210 comprises multiple compartments. In a first compartment, the substrate to be treated is first treated with moisture. Subsequently, the substrate continues to be moved to another compartment where vapors of active ingredients are applied to the substrate. Where multiple active ingredients are used, the substrate may be moved through a plurality of moisture compartments and a plurality of chemical vapor compartments. After the chemical vapor deposition process is complete and the substrate is coated with the desired film coating, the substrate exits the treatment chamber 210. In the meanwhile, any unreacted chemicals and acidic byproducts in the carrying air are neutralized prior to be released to the environment according to the preferred embodiments.

FIGS. 17 and 18 illustrate a preferred method for creating film coatings on a substrate in a closed chemical vapor deposition system. According to the preferred embodiment, a substrate 120 to be treated is placed on the conveyor 234, securely held by a pair of mechanical arms 236 and 238, and moved into the cylindrical treatment chamber 210 for a series of water and chemical vapor treatments. In FIGS. 17 and 18, an example of such substrate is illustrated as a beverage bottle. As the substrate 120 enters the first compartment 250, the first water vapor inlet 226 deposits moisture onto the surface of the bottle 120 as it is conveyed through the first compartment 250. After the moisture deposit is complete, a first vacuum channel 246 evacuates airborne moisture at the margin of the first compartment 250 into the vapor duct 280 and leaves only moisture on the surface of the substrate 120. Subsequently, the substrate 120 passes through an air curtain 216-2, and enters the second compartment 260 for a first chemical vapor deposition treatment of a first active ingredient.

Upon entering the second compartment 260, the first chemical vapor inlet 228 deposits vapor of the first active chemical ingredient onto the substrate 120 according to a predetermined period of time. The moisture on the surface of the substrate 120 reacts with the chemical vapor to form a film coating on the surface of the substrate 120. As the substrate 120 is conveyed through the second compartment 260, the first chemical vapor deposition is completed and a second vacuum channel 246-2 at the margin of the second compartment 260 evacuates any unreacted chemical ingredients and acidic byproducts into the vapor duct 280 below the conveyor belt 234. The substrate 120 is then conveyed through a third air curtain 216-3.

The substrate 120 enters the third compartment 270, wherein a second water vapor inlet 226-2 deposits moisture onto the surface of the substrate according to a predetermined period of time, in preparation for a second treatment of a second active chemical ingredient. Similar to the first moisture treatment, at the margin of the third compartment 270, a third vacuum channel 246-3 evacuates airborne moisture into the vapor duct 280 and leaves only moisture on the surface of the substrate 120. The substrate 120 then passes through a fourth air curtain 216-4 and enters the fourth compartment 280 for the second chemical vapor deposition treatment of the second active ingredient.

In the fourth compartment 280, the second chemical vapor inlet 228-2 deposits the vapor of the second active ingredient onto the surface of the substrate 120 as it is conveyed through the fourth compartment 280. The moisture on the surface of the substrate 120 reacts with the chemical vapor to form a second film coating on the surface of the substrate 120. As the substrate 120 is conveyed through the fourth compartment 280, the second chemical vapor deposition is completed and a fourth vacuum channel 246-4 at the margin of the compartment 280 evacuates any unreacted chemical ingredients and acidic byproducts into the vapor duct 280 below the conveyor belt. The substrate 120 passes through a fifth air-curtain 216-5 and continues to enter the fifth compartment 290.

Upon entering the fifth compartment 290, the compressed air nozzle 232 applies high pressure compressed air onto the substrate 120 and evacuates byproducts into the vapor duct 280 via a vacuum channel 248-9 as it is conveyed through the compartment 290 to remove excess chemicals from the surface of the substrate. After the process is complete, the treated substrate 120 then passes through a final air-curtain 216-6 and exits the cylindrical chemical vapor deposition chamber.

It is to be understood that the chemical vapor deposition system 200 may employ more than two types of active ingredients, and as such may comprise multiple moisturization compartments and multiple chemical vapor treatment compartments.

Any unreacted chemicals and acidic byproducts that result from the chemical vapor deposition process according to the system 200 are neutralized in the neutralization system 224 prior to the carrying air being released to open environment. In one embodiment, neutralizing agents, such as basic solution, are stored in the solvent reservoir 240. During the chemical vapor deposition process, any unreacted chemicals and acidic byproducts enter the vapor duct 280 below the conveyor belt 234 via the plurality of vacuum channels 246. The reservoir pump 242 then draws the basic solution from the solvent reservoir 240 and delivers the basic solution to the vapor duct 280 through the plurality of solvent inlets 248 to neutralize the acidic byproducts and unreacted chemicals inside the vapor duct 280. After the vapors are completely neutralized, the harmless vapors are released to open air via the duct opening 274.

In another embodiment, any unreacted chemicals and acidic byproducts are passed through an air-scrubber that filters the air and neutralizes any airborne acid. In one aspect, the air scrubber comprises a particle filter and a series of trays filled with an acid-absorbing or neutralizing media. The resulting output from the air scrubber is a pH neutral air that contains no harmful elements.

Figure 19:
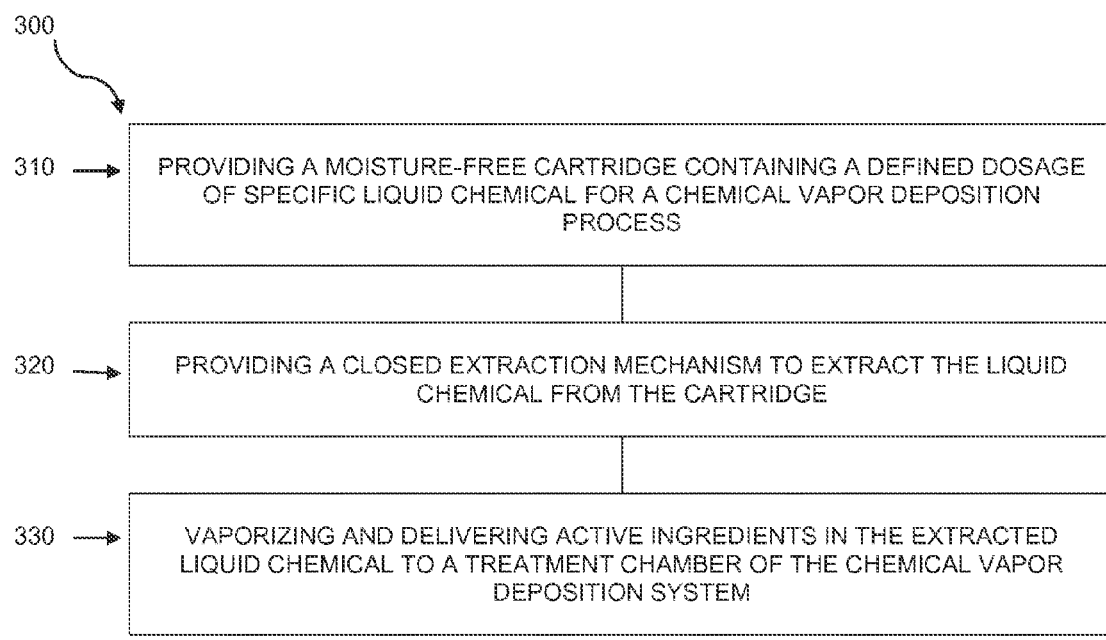
FIG. 19 is a diagram of a preferred method of introducing air sensitive liquid chemical to a substrate in a closed chemical vapor deposition system.

FIG. 19 illustrates a preferred method 300 of introducing air sensitive liquid chemical to a substrate in a closed chemical vapor deposition system. The method 300 may comprise a step 310 of providing a moisture-free cartridge containing a defined dosage of specific liquid chemical for a chemical vapor deposition process, a step 320 of providing a closed extraction mechanism to extract the liquid chemical from the cartridge, and a step 330 of vaporizing and delivering active ingredients in the extracted liquid chemical to a treatment chamber of the chemical vapor deposition system.

The step 310 of providing a moisture-free cartridge containing a defined dosage of specific liquid chemical for a chemical vapor deposition process may further comprise removing ambient moisture from a vial according to a predetermined amount of time, dispensing the defined dosage of the liquid chemical into the vial under inert gas blanket, sealing the vial with a barrier and a cap, and placing the vial inside a protective shell.

In one preferred embodiment, the step of removing ambient moisture from the vial according to the predetermined amount of time may comprise flushing the vial with nitrogen gas for a period of time to displace the ambient air from the interior of the vial with nitrogen. Alternatively, this step may be performed by applying vacuum pressure to the vial for a period of time and subsequently flushing the vial with nitrogen gas.

The step of dispensing the defined dosage of the liquid chemical into the vial under inert gas blanket may comprise maintaining the interior of the vial under nitrogen flush, measuring a precise amount of liquid chemical to be used in the chemical vapor deposition and dispensing the measured dosage of liquid chemical into the vial under nitrogen flush.

The step of placing the vial inside a protective shell may further comprise providing the protective shell having a hollow chamber that securely fits the vial and an external shape configured to fit in a mounting slot of an automated chemical introduction system. In one preferred embodiment, the protective shell may include a cylindrical external shape. In another preferred embodiment, the protective shell may include a rectangular external shape. It is to be understood that the protective shell is not limited to the stated embodiments and may employ any geometric shape that matches a particular mounting slot. In another alternative embodiment, an external portion of the shell near the opening of the hollow chamber may be threaded to allow a matching cap with internal thread for additional protection during shipping and handling.

The step 320 of providing a closed extraction mechanism to extract the liquid chemical from the cartridge may further comprise providing a mounting slot on a chemical introduction system that is configured to receive a cartridge having a particular shape that matches the mounting slot, providing a cartridge securing mechanism above the mounting slot that is movable in a vertical direction to secure the cartridge during liquid chemical extraction, providing an extraction lance attached to a lower linear mechanical actuator below the mounting slot that is movable in a vertical direction to extract liquid chemical from the cartridge, and providing a chemical collection block to collect the extracted liquid chemical. In another embodiment, a ridged sleeve may be provided to enclose the extraction lance. In yet an alternative embodiment, a bellows may be provided to enclose the ridged sleeve.

Preferably, the cartridge securing mechanism may comprise a retainer clip. In an alternative embodiment, the cartridge securing mechanism may comprise a clear containment cover. Further, the cartridge securing mechanism may be automatically operated by a PLC or manually operated by hand. According to a preferred method, the step 320 further comprises placing the cartridge face down on the matching mounting slot of the chemical introduction system. When the system is activated, the cartridge securing mechanism is configured to secure the cartridge in preparation of the liquid chemical extraction. In the embodiment where the cartridge securing mechanism comprises the clear containment cover to completely enclose the cartridge, a nitrogen supply is provided to purge the interior of the containment cover of moisture once the cartridge is enclosed.

The step 320 further comprises activating the lower linear mechanical actuator to move in an upward direction to raise the extraction lance and puncture the cartridge with the extraction lance. Nitrogen pressure is applied into the cartridge through the extraction lance to assist the liquid chemical to drain down the lance and get collected in the chemical collection block.

The step 330 of vaporizing and delivering active ingredients in the extracted liquid chemical to a treatment chamber of the chemical vapor deposition system may further comprise providing a vaporization chamber to receive the liquid chemical from the chemical collection block, drawing compressed air over the liquid chemical according to a predetermined period of time to evaporate the liquid chemical, and delivering active ingredients in a vapor state to the treatment chamber through an outlet by applying further compressed air pressure to the vaporization chamber.

Figure 20:
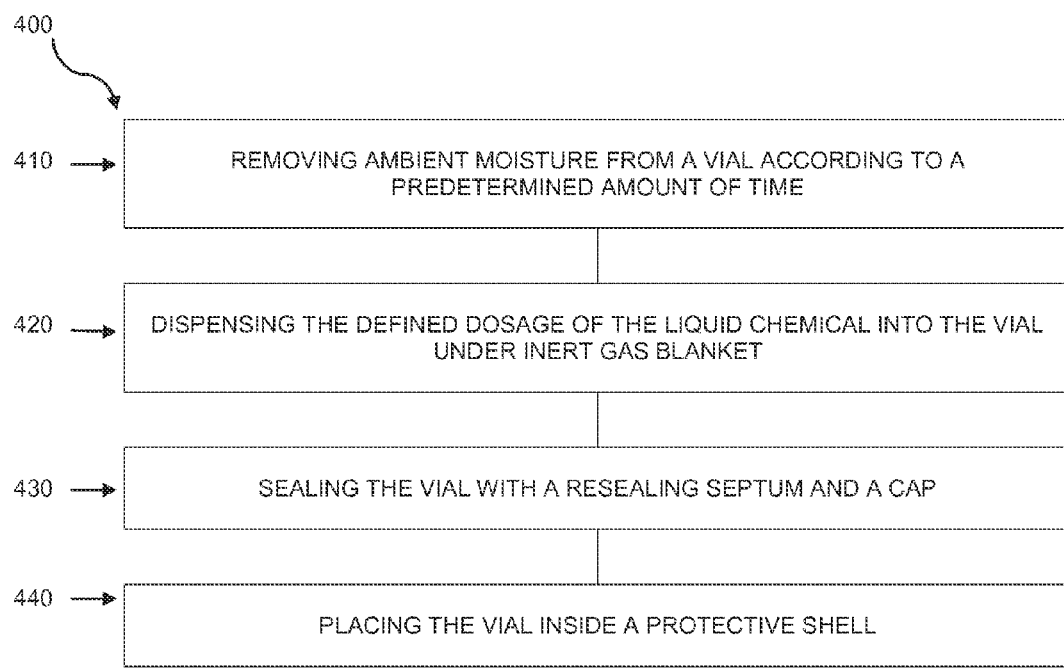
FIG. 20 is diagram of a preferred method of preparing a moisture-free cartridge containing air-sensitive liquid chemical for use in a chemical vapor deposition system.

FIG. 20 illustrates a preferred method 400 of preparing a moisture-free cartridge containing air-sensitive liquid chemical for use in a chemical vapor deposition system. The method 400 may comprise a step 410 of removing ambient moisture from a vial according to a predetermined period of time, a step 420 of dispensing a defined dosage of the liquid chemical into the vial under inert gas blanket, a step 430 of sealing the vial with a barrier and a cap, and a step 440 of placing the vial inside a protective shell.

The step 410 of removing ambient moisture from the vial according to the predetermined period of time may further comprise flushing the vial with nitrogen gas for a period of time to displace the ambient air from the interior of the vial with nitrogen. Alternatively, this step may be performed by applying vacuum pressure to the vial for a period of time and subsequently flushing the vial with nitrogen gas.

The step 420 of dispensing a defined dosage of the liquid chemical into the vial under inert gas blanket may further comprise maintaining the interior of the vial under nitrogen flush, measuring a precise amount of liquid chemical to be used in the chemical vapor deposition and dispensing the measured dosage of liquid chemical into the vial under nitrogen flush.

The step 440 of placing the vial inside a protective shell may further comprise providing the protective shell having a hollow chamber that securely fits the vial and an external shape configured to fit in a mounting slot of an automated chemical introduction system. In one preferred embodiment, the protective shell may include a cylindrical external shape. In another preferred embodiment, the protective shell may include a rectangular external shape. It is to be understood that the protective shell is not limited to the stated embodiments and may employ any geometric shape that matches a particular mounting slot. In an alternative embodiment, an external portion of the shell near the opening of the hollow chamber may be threaded to allow a matching cap with internal thread for additional protection during shipping and handling.

Figure 21:
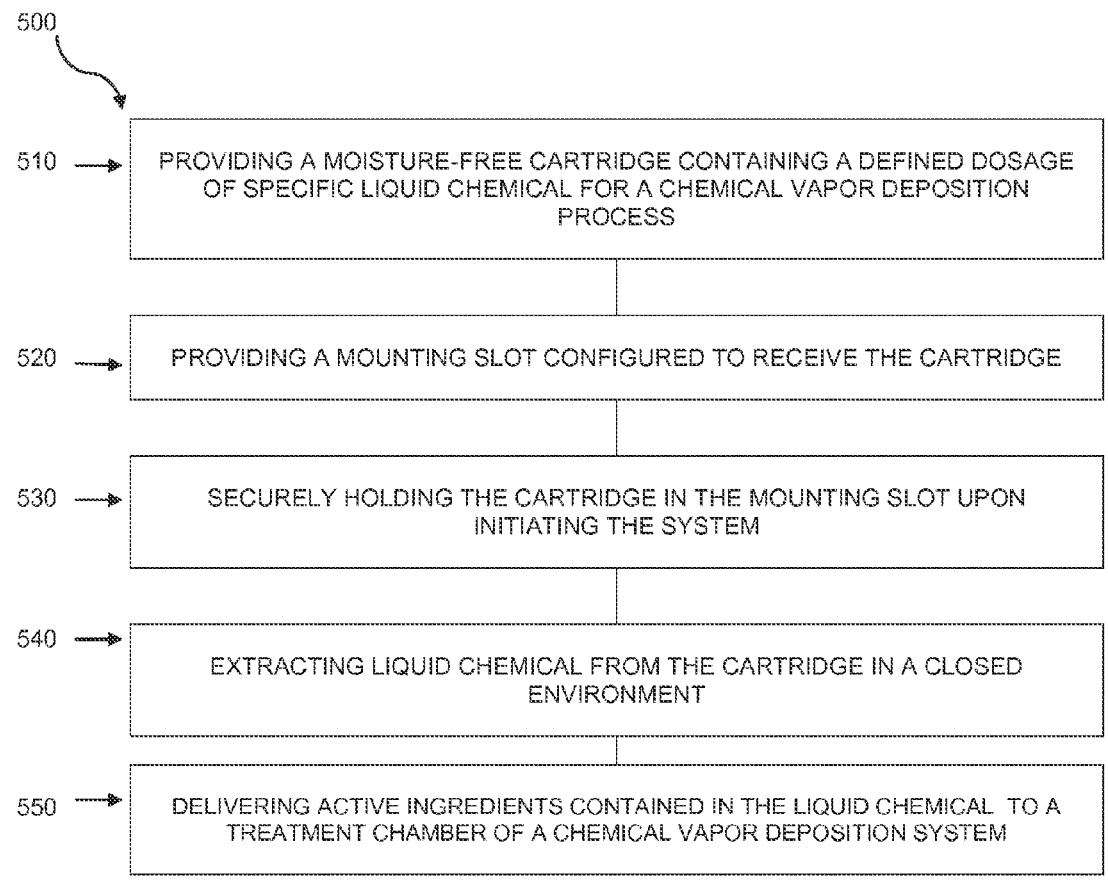
FIG. 21 is a diagram of another preferred method of automatically introducing air sensitive liquid chemical to a substrate in a closed chemical vapor deposition system.

FIG. 21 illustrates another preferred method 500 of automatically introducing air sensitive liquid chemical to a substrate in a closed chemical vapor deposition system. The method 500 may comprise a step 510 of providing a moisture-free cartridge containing a defined dosage of specific liquid chemical for a chemical vapor deposition process, a step 520 providing a mounting slot configured to receive the cartridge, a step 530 of securely holding the cartridge in the mounting slot upon initiating the system, a step 540 of extracting liquid chemical from the cartridge in a closed environment; and a step 550 of delivering active ingredients contained in the liquid chemical to a treatment chamber of a chemical vapor deposition system.

The step 510 of providing a moisture-free cartridge containing a defined dosage of specific liquid chemical for a chemical vapor deposition process may further comprise removing ambient moisture from a vial according to a predetermined amount of time, dispensing the defined dosage of the liquid chemical into the vial under inert gas blanket, sealing the vial with a barrier and a cap, and placing the vial inside a protective shell.

The step 520 of providing a mounting slot configured to receive the cartridge may further comprise providing a mounting slot with a shape that matches the bottom portion of the cartridge. In yet another embodiment, the step 520 may further comprise providing a plurality of mounting slots.

The step 530 of securely holding the cartridge in the mounting slot upon initiating the system may further comprise providing a cartridge securing mechanism that is movable in a vertical direction to securely hold the cartridge in the mounting slot upon initiating the system and during the extraction process. In one embodiment, the cartridge securing mechanism may comprise a retainer clip. In an alternative preferred embodiment, a clear containment cover may be provided. In such embodiment, an inert gas such as nitrogen, may be introduced to the clear containment cover to purge any moisture.

The step 530 may be performed manually by hand or operated automatically using a PLC.

The step 540 of extracting liquid chemical from the cartridge in a closed environment may further comprise providing an extracting lance attached to a lower linear mechanical actuator that is movable in a vertical direction, wherein the lower mechanical actuator raises the lance to puncture the cartridge and draw the liquid chemical upon initiating the system, and wherein the extracting lance supplies nitrogen pressure into the cartridge. The lower linear mechanical actuator may be manually moved by hand or automatically moved by the PLC. Additionally, the step 530 may further comprise providing a chemical extraction block to collect the liquid chemical. In a preferred embodiment, the step 530 may further comprise enclosing the extraction lance inside a ridged sleeve system. In an alternative embodiment, a bellow may be provided to cover the ridged sleeve system.

The step 550 of delivering active ingredients contained in the liquid chemical to a treatment chamber of a chemical vapor deposition system may comprise providing a vaporization compartment configured to evaporate the liquid chemical extracted from the cartridge to a vapor state and carry active ingredients in the vapor to a treatment chamber of a chemical vapor deposition system.

Figure 22:
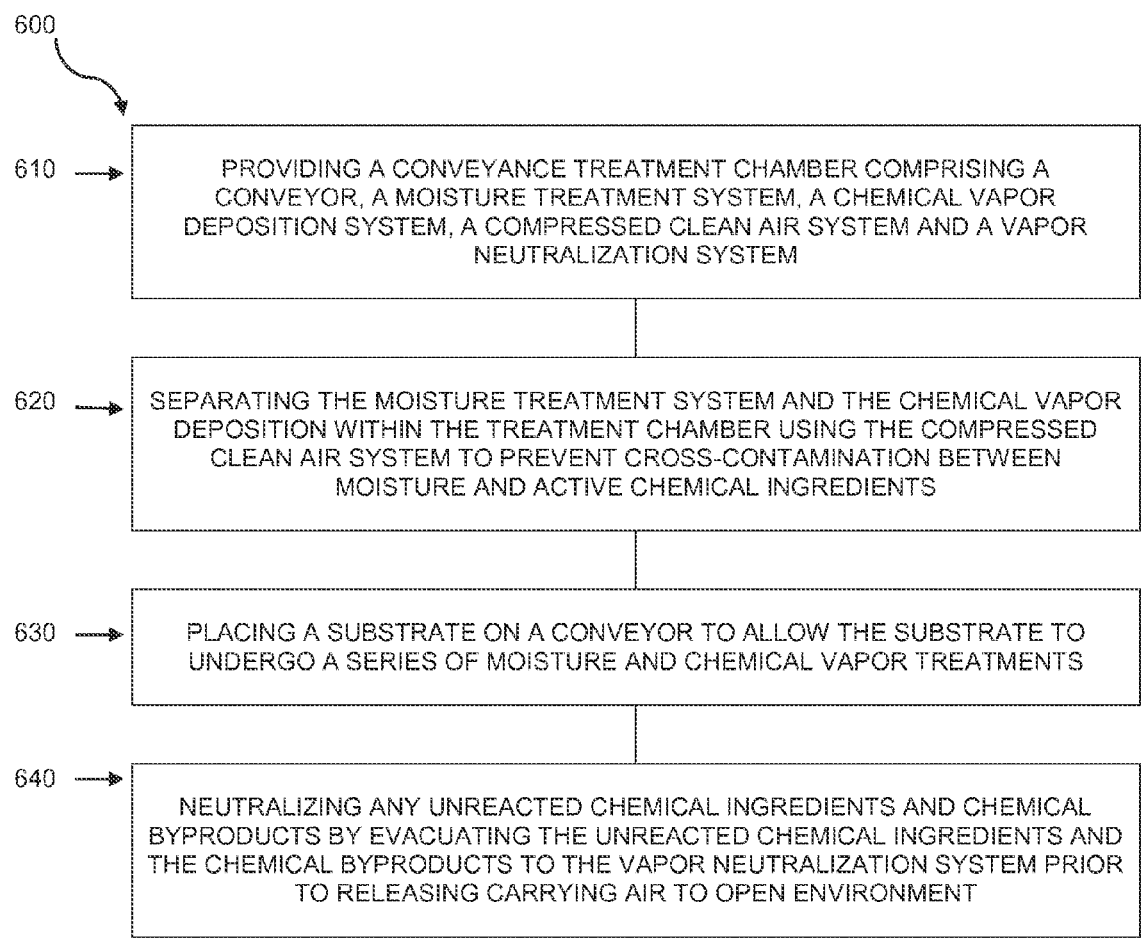
FIG. 22 is a diagram of a preferred method of creating protective film coatings on organic and inorganic substrates by chemical vapor deposition.

FIG. 22 illustrates a preferred method 600 of creating protective film coatings on organic and inorganic substrates by chemical vapor deposition. The method 600 may comprise a step 610 of providing a conveyance treatment chamber comprising a conveyor, a moisture treatment system, a chemical vapor deposition system, a compressed clean air system and a vapor neutralization system; a step 620 of separating the moisture treatment system and the chemical vapor deposition within the treatment chamber using the compressed clean air system to prevent cross-contamination between moisture and active chemical ingredients; a step 630 of placing a substrate on a conveyor to allow the substrate to undergo a series of moisture and chemical vapor treatments; and a step 640 of neutralizing any unreacted chemical ingredients and chemical byproducts by evacuating the unreacted chemical ingredients and the chemical byproducts to the vapor neutralization system prior to releasing carrying air to open environment.

The step 610 of providing a conveyance treatment chamber comprising a conveyor, a moisture treatment system, a chemical vapor deposition system, a compressed clean air system and a vapor neutralization system may further comprise placing the moisture treatment system above and along the conveyor, wherein the moisture treatment system includes a plurality of water vapor inlets. Additionally, the step 610 may also comprise placing the chemical vapor deposition system above and along the conveyor, wherein the chemical vapor deposition system includes a plurality of chemical vapor inlets.

The step 620 of separating the moisture treatment system and the chemical vapor deposition within the treatment chamber using the compressed clean air system to prevent cross-contamination between moisture and active chemical ingredients may further comprise providing a central clean air source, providing a main air duct connected to the clean air source, and providing a plurality of air curtains connected to the main air duct, placed above and along the length of the conveyor to separate a moisture treatment compartment and a chemical vapor compartment using an air curtain.

The step 640 of neutralizing any unreacted chemical ingredients and chemical byproducts by evacuating the unreacted chemical ingredients and the chemical byproducts to the vapor neutralization system prior to releasing carrying air to open environment may further comprise providing a plurality of vacuum channels below the conveyor to evacuate the unreacted active ingredients and byproducts to a vapor duct, providing a solvent reservoir containing a neutralizing agent, providing a plurality of neutralizing solvent inlets in the vapor duct, and providing a solvent pump to draw the neutralizing agent from the solvent reservoir and deliver the neutralizing agent to the plurality of solvent inlets to neutralize harmful vapors inside the vapor duct prior to releasing the vapors. Alternatively, the step 640 may comprise providing an air scrubber further comprising a particle filter and a series of trays filled with acid-absorbing or neutralizing media.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different ones of the disclosed elements.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

In substantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what incorporates the essential idea of the invention.

What is claimed is:

1. A method of automatically introducing air sensitive liquid chemical to a substrate in a closed chemical vapor deposition system comprising:
   providing a moisture-free cartridge containing a defined dosage of specific liquid chemical for a chemical vapor deposition process;
   providing a closed extraction mechanism to extract the liquid chemical from the cartridge;
   providing a mounting slot in a chemical introduction system configured to receive the cartridge that matches the mounting slot;
   providing a cartridge securing mechanism above the mounting slot that is movable in a vertical direction to secure the cartridge during liquid chemical extraction;
   providing an extraction lance attached to a separate lower linear mechanical actuator below the mounting slot that is movable in a vertical direction to extract liquid chemical from the cartridge;
   providing a chemical collection block to collect the extracted liquid chemical; and
   vaporizing and delivering active ingredients in the extracted liquid chemical to a treatment chamber of the chemical vapor deposition system.

2. The method of claim 1, wherein the step of providing a moisture-free cartridge containing a defined dosage of specific liquid chemical for a chemical vapor deposition process further comprises:
   removing ambient moisture from a vial according to a predetermined amount of time;
   dispensing the defined dosage of the liquid chemical into the vial under inert gas blanket;
   sealing the vial with a barrier and a cap; and
   placing the vial inside a protective shell.

3. The method of claim 2, wherein the step of removing ambient moisture from a vial according to a predetermined amount of time further comprises flushing the vial with nitrogen gas according to a predetermined amount of time.

4. The method of claim 2, wherein the step of removing ambient moisture from a vial according to a predetermined amount of time further comprises applying vacuum pressure to the vial according to a predetermined amount of time and filling the vial with nitrogen gas.

5. The method of claim 2, wherein the step of placing the vial inside a protective shell further comprises providing the protective shell having a shape configured to fit in a mounting slot of an automated chemical introduction system.

6. The method of claim 1, wherein the step of providing a cartridge securing mechanism further comprises attaching a retainer clip to the cartridge securing mechanism.

7. The method of claim 1, wherein the step of providing a cartridge securing mechanism further comprises attaching a clear containment cover and a nitrogen supply to the cartridge securing mechanism.

8. The method of claim 1, wherein the step of delivering active ingredients in the extracted liquid chemical to a treatment chamber of the chemical vapor deposition system further comprises:
   providing a vaporization chamber to receive the liquid chemical from the chemical collection block;
   drawing compressed air over the liquid chemical according to a predetermined amount of time to evaporate the liquid chemical; and
   delivering active ingredients in a vapor state to the treatment chamber through an outlet by applying further compressed air pressure to the vaporization chamber.

9. A method of automatically introducing air sensitive liquid chemical to a substrate in a closed chemical vapor deposition system comprising:
   providing a moisture-free cartridge containing a defined dosage of specific liquid chemical for a chemical vapor deposition process;
   providing a mounting slot configured to receive the cartridge;
   securely holding the cartridge in the mounting slot upon initiating the system;
   extracting liquid chemical from the cartridge in a closed environment;
   delivering active ingredients contained in the liquid chemical to a treatment chamber of a chemical vapor deposition system;
   providing an extracting lance attached to a linear mechanical actuator that is movable in a vertical direction, wherein the linear mechanical actuator raises the lance to puncture the cartridge and draw the liquid chemical upon initiating the system and wherein the extracting lance supplies nitrogen pressure into the cartridge; and
   providing a chemical extraction block to collect the liquid chemical.

10. The method of claim 9, wherein the step of providing a moisture-free cartridge containing a defined dosage of specific liquid chemical for a chemical vapor deposition process further comprises:
   removing ambient moisture from a vial according to a predetermined amount of time;
   dispensing the defined dosage of the liquid chemical into the vial under inert gas blanket;
   sealing the vial with a barrier and a cap; and
   placing the vial inside a protective shell.

11. The method of claim 9, wherein the step of securely holding the cartridge in the mounting slot upon initiating the system further comprises:
   providing a cartridge securing mechanism that is movable in a vertical direction to securely hold the cartridge in the mounting slot upon initiating the system and during the extraction process.

12. The method of claim 9, wherein the step of delivering active ingredients contained in the liquid chemical to a treatment chamber of a chemical vapor deposition system further comprises:
   providing a vaporization compartment configured to evaporate the liquid chemical extracted from the cartridge to a vapor state and carry active ingredients in the vapor to a treatment chamber of a chemical vapor deposition system.

* * * * *